(12) United States Patent
Kim et al.

(10) Patent No.: US 12,527,159 B2
(45) Date of Patent: Jan. 13, 2026

(54) DISPLAY APPARATUS AND METHOD OF MANUFACTURING THE SAME

(71) Applicant: Samsung Display Co., Ltd., Yongin-si (KR)

(72) Inventors: Hyun Kim, Yongin-si (KR); Seulki Kim, Yongin-si (KR); Kapsoo Yoon, Yongin-si (KR); Woogeun Lee, Yongin-si (KR); Seungha Choi, Yongin-si (KR); Yeeun Kang, Yongin-si (KR); Shoyeon Kim, Yongin-si (KR); Seungrae Kim, Yongin-si (KR); Donghyun Won, Yongin-si (KR); Kwangsoo Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 759 days.

(21) Appl. No.: 17/878,449

(22) Filed: Aug. 1, 2022

(65) Prior Publication Data

US 2023/0123185 A1    Apr. 20, 2023

(30) Foreign Application Priority Data

Oct. 19, 2021  (KR) .................. 10-2021-0139116

(51) Int. Cl.
*H10K 59/121*  (2023.01)
*H10D 30/67*   (2025.01)
(Continued)

(52) U.S. Cl.
CPC ....... *H10K 59/1213* (2023.02); *H10K 59/123* (2023.02); *H10K 59/124* (2023.02);
(Continued)

(58) Field of Classification Search
CPC ............ H10K 59/1213; H10K 59/124; H10D 30/6729; H10D 30/6757; H10D 30/0314; H10D 30/673
See application file for complete search history.

(56) References Cited

U.S. PATENT DOCUMENTS 11,133,370 B2   9/2021  Yoon et al.
11,211,582 B2  12/2021  Kim et al.
(Continued)

FOREIGN PATENT DOCUMENTS

CN        1866482 A      11/2006
KR   10-2017-0078969      7/2017
(Continued)

OTHER PUBLICATIONS

Notice of Allowance issued by MOIP for application No. 10-2021-0139116 dated Oct. 23, 2025, 3 pages.

*Primary Examiner* — Chad M Dicke
*Assistant Examiner* — Dave Tan
(74) *Attorney, Agent, or Firm* — Innovation Counsel LLP

(57) ABSTRACT

A display apparatus includes a semiconductor layer arranged on a substrate and including a channel area and a source area and a drain area respectively arranged at both sides of the channel area, the semiconductor layer including an opening portion arranged to be adjacent to one of the source area and the drain area, an electrode overlapping in a plan view and electrically connected to one of the source area and the drain area, and an insulating pattern arranged between the semiconductor layer and the electrode, wherein a first edge of the electrode adjacent to the opening portion is spaced apart from the opening portion, and an edge portion of the insulating pattern adjacent to the opening portion is spaced apart from the opening portion.

20 Claims, 32 Drawing Sheets

(51) Int. Cl.
  *H10D 86/40*   (2025.01)
  *H10D 86/60*   (2025.01)
  *H10K 59/12*   (2023.01)
  *H10K 59/123*  (2023.01)
  *H10K 59/124*  (2023.01)
  *H10K 71/00*   (2023.01)

(52) U.S. Cl.
  CPC ......... *H10K 71/00* (2023.02); *H10D 30/6729* (2025.01); *H10D 30/6755* (2025.01); *H10D 86/423* (2025.01); *H10D 86/60* (2025.01); *H10K 59/1201* (2023.02)

(56) References Cited

U.S. PATENT DOCUMENTS

| | | |
|---|---|---|
| 2019/0181207 A1* | 6/2019 | Kim ................. H10D 99/00 |
| 2021/0036032 A1 | 2/2021 | Lee et al. |
| 2021/0183898 A1 | 6/2021 | Jeong et al. |
| 2021/0343811 A1 | 11/2021 | Kim et al. |
| 2021/0391409 A1 | 12/2021 | Yoon et al. |
| 2022/0123262 A1 | 4/2022 | Kim et al. |

FOREIGN PATENT DOCUMENTS

| | | |
|---|---|---|
| KR | 10-1890215 | 8/2018 |
| KR | 10-2020-0088940 | 7/2020 |
| KR | 10-2020-0135911 | 12/2020 |
| KR | 10-2021-0014795 | 2/2021 |
| KR | 10-2021-0076695 | 6/2021 |
| KR | 10-2021-0135386 | 11/2021 |

\* cited by examiner

DISPLAY APPARATUS AND METHOD OF MANUFACTURING THE SAME

CROSS-REFERENCE TO RELATED APPLICATION(S)

This application is based on and claims priority to and benefits of Korean Patent Application No. 10-2021-0139116 under 35 U.S.C. § 119, filed on Oct. 19, 2021, in the Korean Intellectual Property Office (KIPO), the entire contents of which are incorporated herein by reference.

BACKGROUND

1. Technical Field

The disclosure relates to a display apparatus and a method of manufacturing the same.

2. Description of the Related Art

A display apparatus is an apparatus that visually displays data. A display apparatus may be used as a display of a small-sized product such as a cellular phone, or a display of a large-sized product such as a television.

A display apparatus may include a liquid-crystal display apparatus that does not directly emit light but uses light of a backlight device or include a light-emitting display apparatus including a display element that may emit light, wherein the display element may include an emission layer.

SUMMARY

One or more embodiments provide a display apparatus including a high quality transistor and a method of manufacturing the display apparatus. However, this objective is an example and does not limit the scope of the disclosure.

Additional aspects will be set forth in part in the description which follows and, in part, will be apparent from the description, or may be learned by practice of the presented embodiments of the disclosure.

According to one or more embodiments, a display apparatus includes a semiconductor layer arranged on a substrate and including a channel area and a source area and a drain area respectively arranged at both sides of the channel area, the semiconductor layer including an opening portion arranged to be adjacent to any one of the source area and the drain area, an electrode overlapping in a plan view and electrically connected to one of the source area and the drain area, and an insulating pattern arranged between the semiconductor layer and the first electrode, wherein a first edge of the electrode adjacent to the opening portion is spaced apart from the opening portion, and an edge portion of the insulating pattern adjacent to the opening portion is spaced apart from the opening portion.

The insulating pattern may include an inner portion directly below the electrode and the edge portion outside the inner portion, and the edge portion of the insulating pattern may partially surround the electrode so as to have a spaced area corresponding to a portion of the first edge of the electrode in a plan view.

A portion of the semiconductor layer, the portion being directly below the first electrode, may include a first portion having a carrier concentration corresponding to one of the source area and the drain area and a second portion having a different carrier concentration from the first portion.

The edge portion of the insulating pattern may include a first portion and a second portion spaced apart from each other with the spaced area below the insulating pattern, each of the first portion and the second portion may extend from the first edge of the electrode in a first direction toward the opening portion, and each of the first portion and the second portion of the edge portion may have a first width in the first direction.

The edge portion of the insulating pattern may further include a third portion extending from a second edge of the electrode that is different from the first edge and having a second width, and the second width may be different from the first width.

The second width may be greater than the first width.

The first width may be less than about 0.5 μm.

The display apparatus may further include a lower conductive layer arranged below the semiconductor layer and a lower insulating layer arranged between the lower conductive layer and the semiconductor layer, wherein the first electrode may be electrically connected to the lower conductive layer through a contact hole penetrating the first insulating pattern and the lower insulating layer.

The semiconductor layer may include an oxide semiconductor material.

The electrode may be provided as a triple layer including a conductive oxide.

According to one or more embodiments, a method of manufacturing a display apparatus includes forming a semiconductor layer on a substrate, the semiconductor layer including a channel area and a source area and a drain area at both sides of the channel area, forming, in the semiconductor layer, an opening portion arranged to be adjacent to one of the source area and the drain area, forming an electrode overlapping in a plan view and electrically connected to one of the source area and the drain area, and forming an insulating pattern by etching an inorganic insulating layer arranged between the semiconductor layer and the electrode, wherein a first edge of the electrode adjacent to the opening portion is spaced apart from the opening portion, and an edge portion of the insulating pattern adjacent to the opening portion is spaced apart from the opening portion.

The forming of the semiconductor layer including the source area and the drain area may include forming a preliminary semiconductor layer on the substrate, patterning the preliminary semiconductor layer into a semiconductor layer, forming an inorganic insulating layer on the patterned semiconductor layer, and forming holes by at least partially etching the inorganic insulating layer, when the holes are formed, an exposed portion of the semiconductor layer may become conductive.

The forming of the opening portion may be simultaneously performed with the forming of the insulating pattern.

The forming of the electrode may include forming a preliminary electrode layer on the inorganic insulating layer, forming a photoresist on the preliminary electrode layer, etching the preliminary electrode layer, and removing the photoresist.

The forming of the opening portion may include etching the preliminary electrode layer, when the preliminary electrode layer is etched, a portion of the semiconductor layer may be removed.

The photoresist may include a central portion having a first thickness, and an edge portion of at least one side surface, the edge portion having a second thickness, and the second thickness may be less than the first thickness.

The forming of the photoresist may include applying a photoresist layer and exposing an edge of at least one side surface of the photoresist layer by using a halftone mask or a slit.

The edge portion of the at least one side surface of the photoresist may include an edge portion of a side surface of the photoresist, the side surface being toward the channel area of the semiconductor layer.

The forming of the insulating pattern may include forming the inorganic insulating layer on the semiconductor layer, etching the photoresist, and etching the inorganic insulating layer, and when the photoresist is etched, the edge portion having the second thickness may be removed.

The semiconductor layer may include an oxide semiconductor.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
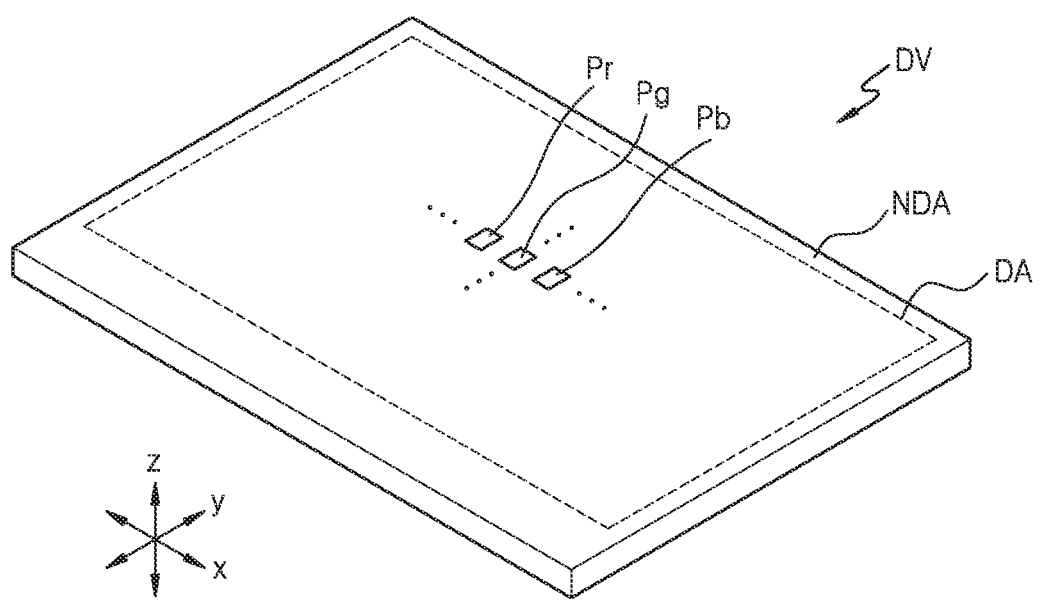
FIG. 1 is a schematic perspective view of a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description. As used herein, the term "and/or" includes any and all combinations of one or more of the associated listed items. The phrase "at least one of" is intended to include the meaning of "at least one selected from the group of" for the purpose of its meaning and interpretation. For example, "at least one of A and B" may be understood to mean "A, B, or A and B."

While the disclosure is capable of various modifications and alternative forms, embodiments thereof are shown by way of example in the drawings and will herein be described in detail. Effects and characteristics of the disclosure, and realizing methods thereof will become apparent by referring to the drawings and embodiments described in detail below. However, the disclosure is not limited to the embodiments disclosed hereinafter and may be realized in various forms.

Hereinafter, embodiments of the disclosure will be described in detail by referring to the accompanying drawings. In descriptions with reference to the drawings, the same reference numerals are given to components that are the same or substantially the same and descriptions will not be repeated.

It will be understood that although the terms "first," "second," and the like may be used herein to describe various components, these components should not be limited by these terms. These components are only used to distinguish one component from another.

As used herein, the singular expressions "a," "an," and "the" are intended to include the plural forms (or meanings) as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or element is referred to as being formed "on" another layer, area, or element, it can be directly or indirectly formed on the other layer, region, or element. That is, for example, intervening layers, regions, or elements may be present.

Sizes of elements in the drawings may be exaggerated for convenience of explanation. For example, sizes and thicknesses of the elements in the drawings are randomly indicated for convenience of explanation, and thus, the disclosure is not necessarily limited to the illustrations of the drawings.

When a certain embodiment may be implemented differently, a specific process order may be performed differently from the described order. For example, two consecutively described processes may be performed substantially at the same time or performed in an order opposite to the described order.

In the embodiments hereinafter, it will be understood that when an element, an area, or a layer is referred to as being connected to another element, area, or layer, it can be directly and/or indirectly connected to the other element, area, or layer. For example, it will be understood in this specification that when an element, an area, or a layer is referred to as being in contact with or being electrically connected to another element, area, or layer, it can be directly and/or indirectly in contact with or electrically connected to the other element, area, or layer.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

FIG. 1 is a schematic perspective view of a display apparatus DV according to an embodiment.

Referring to FIG. 1, the display apparatus DV may include a display area DA and a non-display area NDA outside the display area DA. The display apparatus DV may provide an image through an array of pixels that are two-dimensionally arranged on an x-y plane in the display area DA. The pixels may include a first pixel, a second pixel, and a third pixel. Hereinafter, for convenience of explanation, descriptions will be given based on a case in which the first pixel is a red pixel Pr, the second pixel is a green pixel Pg, and the third pixel is a blue pixel Pb.

The red pixel Pr, the green pixel Pg, and the blue pixel Pb may be areas for emitting red light, green light, and blue light, respectively, and the display apparatus DV may provide an image by using the light emitted from the pixels.

The non-display area NDA is an area where an image is not displayed, and the non-display area NDA may completely surround the display area DA. A driver or a main voltage line configured to provide electrical signals or power to pixel circuits may be arranged in the non-display area NDA. The non-display area NDA may include a pad, which is an area, to which an electronic device or a printed circuit board may be electrically connected.

The display area DA may have a polygonal shape including a quadrangular shape as illustrated in FIG. 1. For example, the display area DA may have a rectangular shape having a horizontal length that is greater than a vertical length, a rectangular shape having a horizontal length that is less than a vertical length, or a square shape. As another example, the display area DA may have various shapes, for example, an oval shape or a circular shape.

Figure 2:
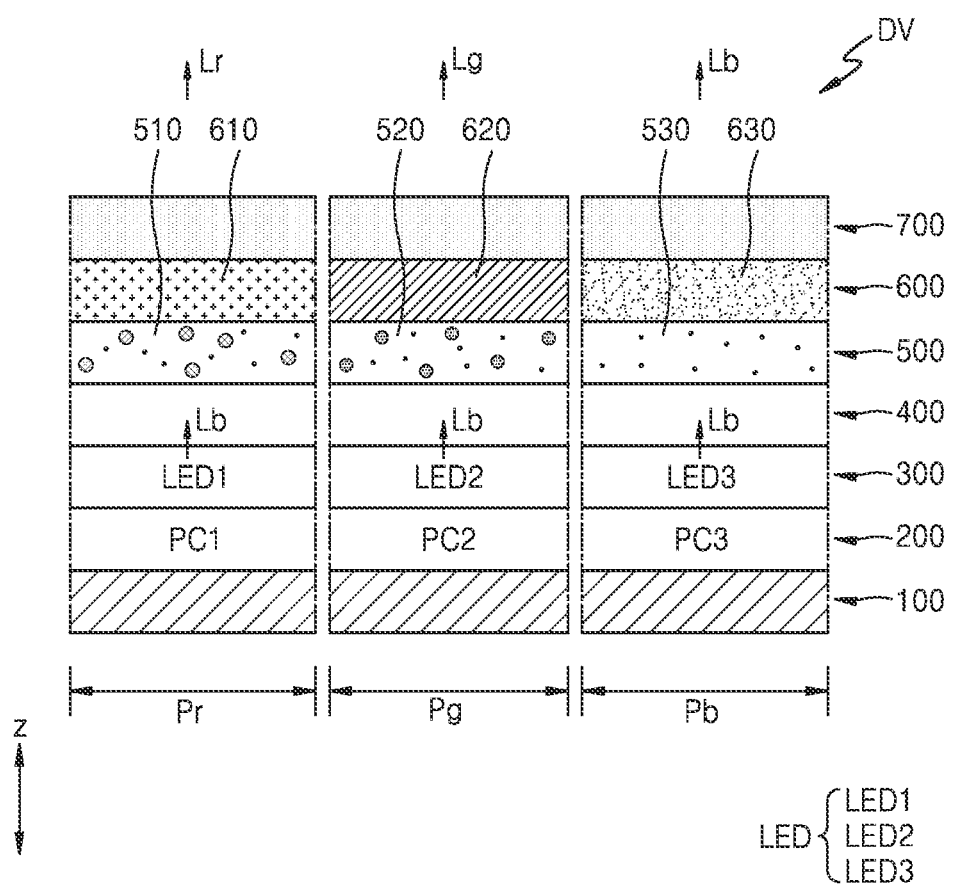
FIG. 2 is a schematic cross-sectional view of each of pixels of a display apparatus according to an embodiment.

FIG. 2 is a schematic cross-sectional view of each of the pixels of the display apparatus DV, according to an embodiment.

Referring to FIG. 2, the display apparatus DV may include a circuit layer 200 on a substrate 100. The circuit layer 200 may include a first pixel circuit PC1, a second pixel circuit PC2, and a third pixel circuit PC3, and the first to third pixel circuits PC1 to PC3 may be electrically connected to a first light-emitting diode LED1, a second light-emitting diode LED2, and a third light-emitting diode LED3 of a light-emitting diode layer 300, respectively.

The first to third light-emitting diodes LED1 to LED3 may include organic light-emitting diodes including organic materials. According to an embodiment, the first to third light-emitting diodes LED1 to LED3 may include inorganic light-emitting diodes including inorganic materials. The inorganic light-emitting diode may include a p-n junction diode including inorganic semiconductor-based materials. In case that a voltage is applied to the p-n junction diode in a forward direction, holes and electrons may be injected into the p-n junction diode, and energy generated by recombination of the holes and the electrons may be converted into light energy to emit a color of light. The inorganic light-emitting diode described above may have a width that is several to hundreds of micrometers or several to hundreds of nanometers. In some embodiments, a light-emitting diode LED may include a light-emitting diode including quantum dots. As described above, an emission layer of the light-emitting diode LED may include an organic material, an inorganic material, quantum dots, an organic material and quantum dots, or an inorganic material and quantum dots.

The first to third light-emitting diodes LED1 to LED3 may emit a same color of light. For example, light (for example, blue light Lb) emitted from the first to third light-emitting diodes LED1 to LED3 may be transmitted through a color-conversion transmission layer 500 by passing through an encapsulation layer 400 on the light-emitting diode layer 300.

The color-conversion transmission layer 500 may include optical portions configured to transmit the light (for example, the blue light Lb) emitted from the light-emitting diode layer 300 by converting or without converting the color of light. For example, the color-conversion transmission layer 500 may include color-conversion portions configured to convert the light (for example, the blue light Lb) emitted from the light-emitting diode layer 300 into another color of light and a transmission portion configured to transmit the light (for example, the blue light Lb) emitted from the light-emitting diode layer 300 without converting the color of light. The color-conversion transmission layer 500 may include a first color-conversion portion 510 corresponding to a red pixel Pr, a second color-conversion portion 520 corresponding to a green pixel Pg, and a transmission portion 530 corresponding to a blue pixel Pb. The first color-conversion portion 510 may convert the blue light Lb into red light Lr, and the second color-conversion portion 520 may convert the blue light Lb into green light Lg. The transmission portion 530 may transmit the blue light Lb without converting the color of light.

A color layer 600 may be arranged on the color-conversion transmission layer 500. The color layer 600 may include a first color filter 610, a second color filter 620, and a third color filter 630 having different colors. For example, the first color filter 610 may be a red color filter, the second color filter 620 may be a green color filter, and the third color filter 630 may be a blue color filter.

The light having the color converted by the color-conversion transmission layer 500 or the light transmitted by the color-conversion transmission layer 500 may have an improved color purity by passing through the first to third color filters 610 to 630. Also, the color layer 600 may prevent or minimize the phenomenon that external light (for example, light that is incident toward the display apparatus DV from the outside of the display apparatus DV) is reflected and viewed (or visually recognized) by a user.

A transmissive substrate layer 700 may be provided on the color layer 600. The transmissive substrate layer 700 may include glass or a transmissive organic material. For example, the transmissive substrate layer 700 may include a transmissive organic material such as an acryl-based resin.

According to an embodiment, the transmissive substrate layer 700 may include a type of substrate. After the color layer 600 and the color-conversion transmission layer 500 are formed on the transmissive substrate layer 700, the transmissive substrate layer 700 may be integral with the encapsulation layer 400 such that the color-conversion transmission layer 500 may face the encapsulation layer 400.

According to an embodiment, after the color-conversion transmission layer 500 and the color layer 600 are sequentially formed on the encapsulation layer 400, the transmissive substrate layer 700 may be directly coated and cured on the color layer 600. In some embodiments, another optical film, for example, an anti-reflection (AR) film, etc., may be arranged on the transmissive substrate layer 700.

The display apparatus DV having the structure described above may include an electronic device capable of displaying a video or a still image, such as a television, a billboard, a movie theater screen, a monitor, a tablet personal computer (PC), a laptop computer, etc.

Figure 3:
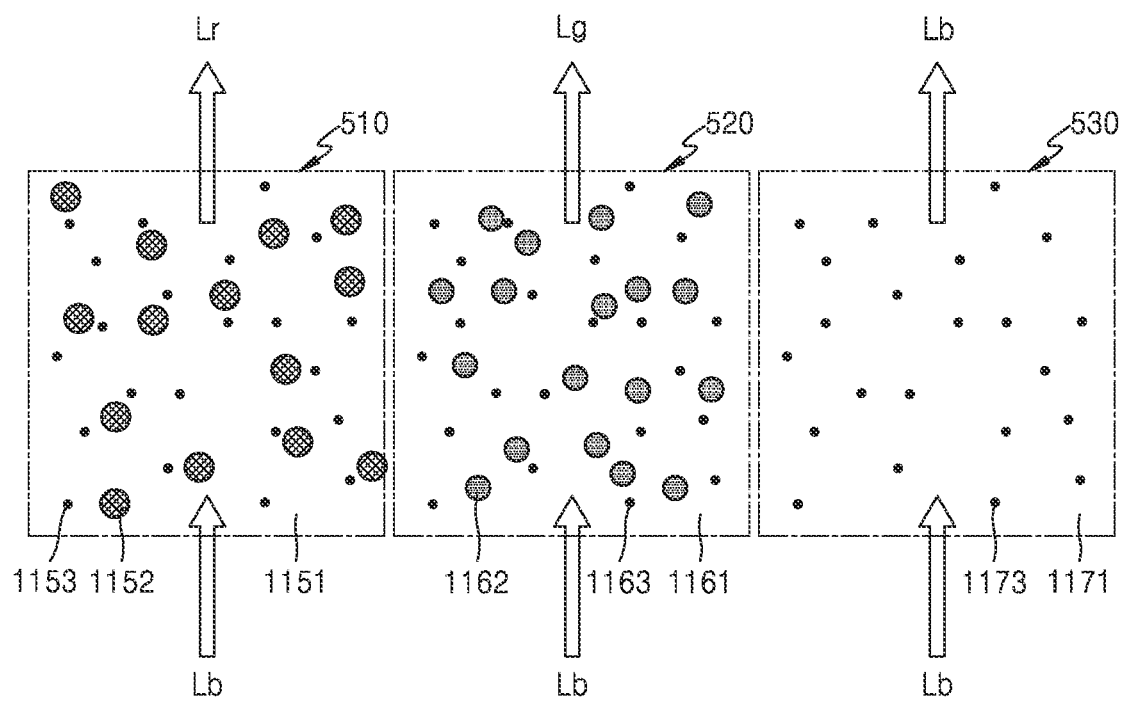
FIG. 3 schematically illustrates each of optical portions of a color-conversion transmission layer of FIG. 2.

FIG. 3 illustrates each of the optical portions of the color-conversion transmission layer 500 of FIG. 2.

Referring to FIG. 3, the first color-conversion portion 510 may convert incident blue light Lb into red light Lr. As illustrated in FIG. 3, the first color-conversion portion 510 may include a first photo-sensitive polymer 1151, first quantum dots 1152, and first scattering particles 1153, and the first quantum dots 1152 and the first scattering particles 1153 are distributed in the first photo-sensitive polymer 1151.

The first quantum dots 1152 may be excited by the blue light Lb and may emit the red light Lr having a greater wavelength than the blue light Lb in an isotropic fashion. The first photo-sensitive polymer 1151 may include a light-transmissive organic material. The first scattering particles 1153 may scatter the blue light Lb not absorbed by the first quantum dots 1152 to excite more first quantum dots 1152, thereby improving the color-conversion efficiency. The first scattering particles 1153 may include, for example, oxide titanium ($TiO_2$) or metal particles. The first quantum dots 1152 may be selected from a Groups II-VI compound, a Groups III-V compound, a Groups IV-VI compound, a Group IV element, a Group IV compound, and a combination thereof.

The second color-conversion portion 520 may convert incident blue light Lb into green light Lg. As illustrated in FIG. 3, the second color-conversion portion 520 may include a second photo-sensitive polymer 1161, second quantum dots 1162, and second scattering particles 1163, and the second quantum dots 1162 and the second scattering particles 1163 are distributed in the second photo-sensitive polymer 1161.

The second quantum dots 1162 may be excited by the blue light Lb and may emit the green light Lg having a greater wavelength than the blue light Lb in an isotropic fashion. The second photo-sensitive polymer 1161 may include a light-transmissive organic material.

The second scattering particles 1163 may scatter the blue light Lb not absorbed by the second quantum dots 1162 to excite more second quantum dots 1162, thereby increasing the color-conversion efficiency. The second scattering particles 1163 may include, for example, $TiO_2$ or metal particles. The second quantum dots 1162 may be selected from a Groups II-VI compound, a Groups III-V compound, a Groups IV-VI compound, a Group IV element, a Group IV compound, and a combination thereof.

The transmission portion 530 may transmit the blue light Lb that is incident on the transmission portion 530 without converting the color of the blue light Lb. As illustrated in FIG. 3, the transmission portion 530 may include a third photo-sensitive polymer 1171 in which third scattering particles 1173 are distributed. The third photo-sensitive polymer 1171 may include a light-transmissive organic material, such as silicon resins, epoxy resins, etc., and the third photo-sensitive polymer 1171 and the first and second photo-sensitive polymers 1151 and 1161 may include a same material. The third scattering particles 1173 may scatter and emit the blue light Lb, and the third scattering particles 1173 and the first and second scattering particles 1153 and 1163 may include a same material.

Figure 4:
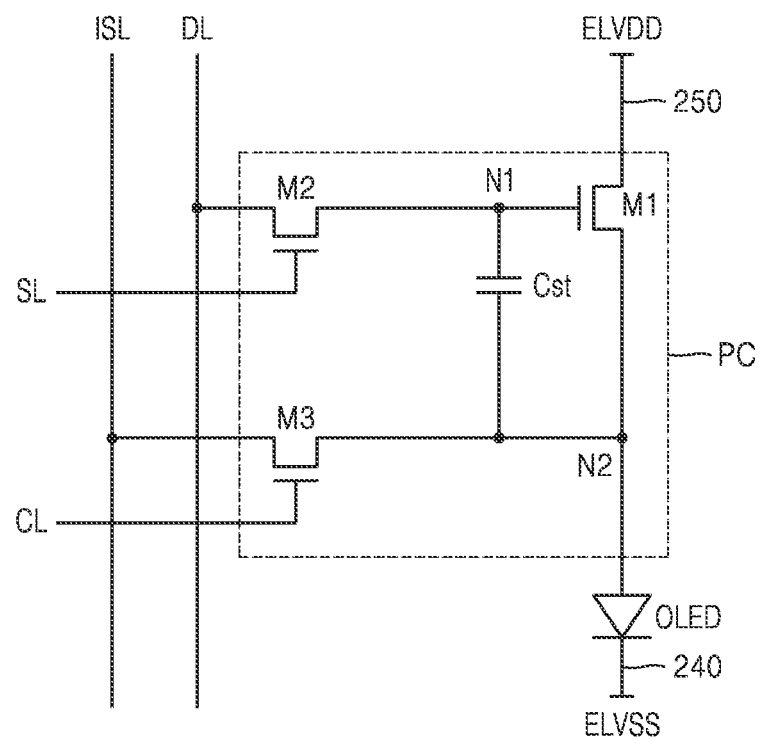
FIG. 4 is a schematic diagram of an equivalent circuit of a light-emitting diode included in a display apparatus and a pixel circuit electrically connected to the light-emitting diode, according to an embodiment.

FIG. 4 is a schematic diagram of an equivalent circuit of a light-emitting diode LED included in a display apparatus and a pixel circuit PC electrically connected to the light-emitting diode, according to an embodiment. The pixel circuit PC illustrated in FIG. 4 may correspond to each of the first to third pixel circuits PC1 to PC3 described above with reference to FIG. 2, and the light-emitting diode of FIG. 4 may correspond to each of the first to third light-emitting diodes LED1 to LED3 described above with reference to FIG. 2.

Referring to FIG. 4, the light-emitting diode LED, for example, a first electrode (for example, an anode) of the light-emitting diode LED, may be electrically connected to the pixel circuit PC, and a second electrode (for example, a cathode) of the light-emitting diode LED may be electrically connected to an auxiliary line 240 configured to provide a common voltage ELVSS. The light-emitting diode LED may emit light with a brightness or luminance corresponding to the amount of current supplied from the pixel circuit PC.

The light-emitting diode LED of FIG. 4 may correspond to each of the first to third light-emitting diodes LED1 to LED3 illustrated in FIG. 2, and the pixel circuit PC of FIG. 4 may correspond to each of the first to third pixel circuits PC1 to PC3 illustrated in FIG. 2.

The pixel circuit PC may be configured to control the amount of current flowing from a driving voltage ELVDD to the common voltage ELVSS through the light-emitting diode LED, in response to a data signal. The pixel circuit PC may include a first transistor M1, a second transistor M2, a third transistor M3, and a storage capacitor Cst.

Each of the first to third transistors T1 to T3 may include an oxide semiconductor transistor including a semiconductor layer including an oxide semiconductor or a silicon semiconductor transistor including a semiconductor layer including polysilicon. According to a type of the transistor, a first electrode of the transistor may be one of a source electrode and a drain electrode, and a second electrode of the transistor may be the other of the source electrode and the drain electrode.

A first electrode of the first transistor M1 may be electrically connected to a driving voltage line 250 configured to supply the driving voltage ELVDD, and a second electrode of the first transistor M1 may be electrically connected to the first electrode of the light-emitting diode LED. A gate electrode of the first transistor M1 may be electrically connected to a first node N1. The first transistor M1 may be configured to control the amount of current flowing through the light-emitting diode LED from the driving voltage ELVDD, in response to a voltage of the first node N1.

The second transistor M2 may include a switching transistor. A first electrode of the second transistor M2 may be electrically connected to a data line DL, and a second electrode of the second transistor M2 may be electrically connected to the first node N1. A gate electrode of the second transistor M2 may be electrically connected to a scan line SL. In case that a scan signal is provided to the second transistor M2 through the scan line SL, the second transistor M2 may be turned on and may electrically connect the data line DL with the first node N1.

The third transistor M3 may include an initialization transistor and/or a sensing transistor. A first electrode of the third transistor M3 may be electrically connected to a second node N2, and a second electrode of the third transistor M3 may be electrically connected to a sensing line ISL. A gate electrode of the third transistor M3 may be electrically connected to a control line CL.

The storage capacitor Cst may be electrically connected between the first node N1 and the second node N2. For example, a first capacitor electrode of the storage capacitor Cst may be electrically connected to the gate electrode of the first transistor M1, and a second capacitor electrode of the storage capacitor Cst may be electrically connected to the first electrode of the light-emitting diode LED.

FIG. 4 illustrates the first transistor M1, the second transistor M2, and the third transistor M3 as n-channel metal oxide semiconductor (NMOS) transistors, but the disclosure is not limited thereto. For example, at least one of the first transistor M1, the second transistor M2, and the third transistor M3 may be provided as a p-channel metal oxide semiconductor (PMOS) transistor.

FIG. 4 illustrates three transistors, but the disclosure is not limited thereto. The pixel circuit PC may include four or more transistors.

At least one of the driving transistor M1, the switching transistor M2, and the sensing transistor M3 may be manufactured by a process described below.

FIGS. 5A, 6A, 7A, 8A, 9A, and 10A are schematic cross-sectional views with respect to a method of manufacturing a display apparatus, according to an embodiment. FIGS. 5B, 6B, 7B, 9B, and 10B are schematic plan views of the display apparatus of FIGS. 5A, 6A, 7A, 9A, and 10A, respectively, and FIG. 8B is a schematic perspective view of a portion of the display apparatus of FIG. 8A. FIGS. 5A, 6A, 7A, 9A, and 10A correspond to cross-sections taken along line A-A' of FIGS. 5B, 6B, 7B, 9B, and 10B, respectively.

Figure 5A:
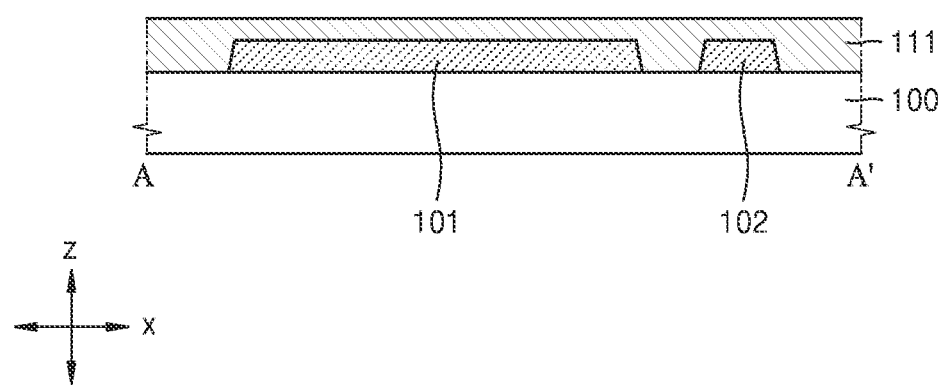
FIGS. 5A, 6A, 7A, 8A, 9A, and 10A are schematic cross-sectional views with respect to a method of manufacturing a display apparatus, according to an embodiment.
Figure 5B:
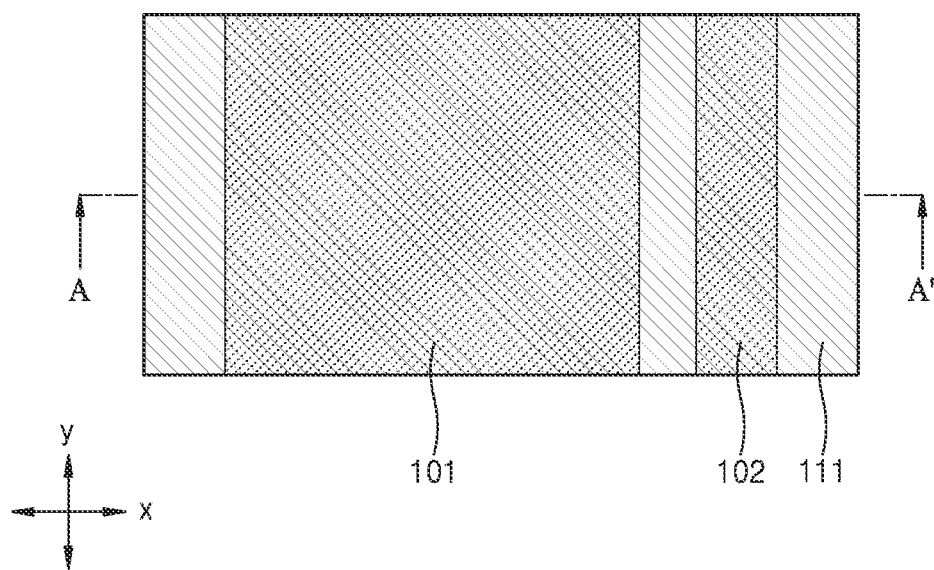
FIGS. 5B, 6B, 7B, 9B, and 10B are schematic plan views of the display apparatus of FIGS. 5A, 6A, 7A, 9A, and 10A, respectively.

Referring to FIGS. 5A and 5B, first, a first lower electrode 101 and a second lower electrode 102 may be formed on the substrate 100, and a buffer layer 111 may be formed on the first lower electrode 101 and the second lower electrode 102. The first lower electrode 101 and the second lower electrode 102 may be formed by patterning a preliminary conductive layer (not shown). The preliminary conductive layer may include a conductive material including Mo, Al, Cu, Ti, or the like and may include a single layer or multiple layers including the materials described above.

According to an embodiment, the first lower electrode 101 and the second lower electrode 102 may have a multi-layered structure. For example, the first lower electrode 101 and the second lower electrode 102 may have a multi-layered structure including Ti/Cu/ITO. Here, in order to prevent a tip of upper ITO, an etching process may be performed twice or more with different etchants, and each of the first lower electrode 101 and the second lower electrode 102 may have a side surface tapered in a normal direction as illustrated in FIG. 5A. According to an embodiment, the etching process may be performed only once by using an etchant for etching all of Ti, Cu, and ITO.

The buffer layer 111 may include an inorganic insulating material, such as $SiN_x$, SiON, and $SiO_x$, and may include a single layer or multiple layers including the inorganic insulating materials described above. The buffer layer 111 may be formed by using a deposition method such as chemical vapor deposition (CVD), sputtering, etc.

Figure 6A:
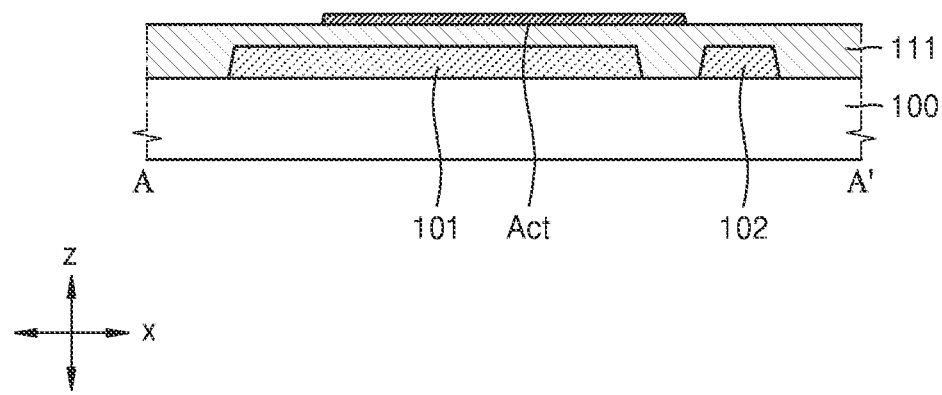
Figure 6B:
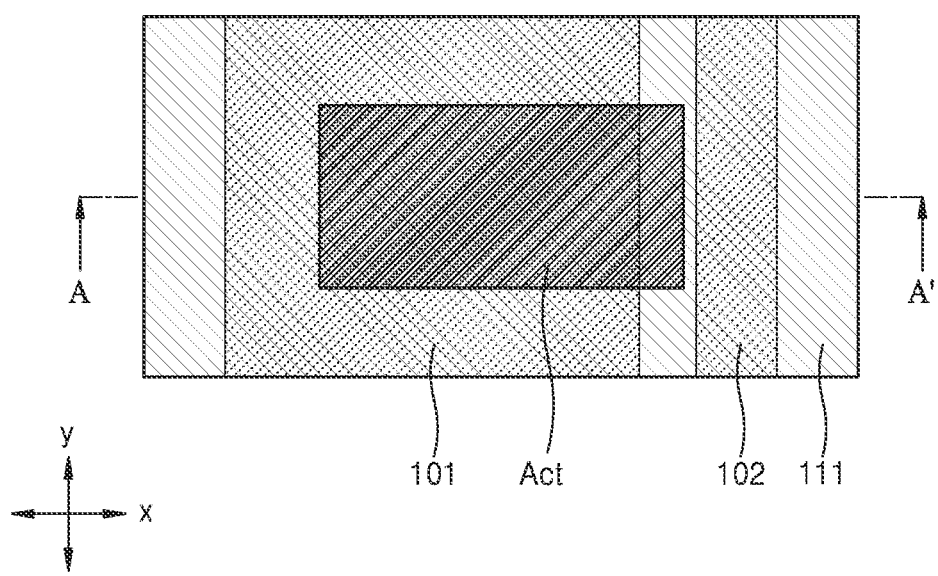

Referring to FIGS. 6A and 6B, a semiconductor layer Act may be arranged on the buffer layer 111. The semiconductor layer Act may include an oxide semiconductor. The oxide semiconductor may include indium gallium zinc oxide (IGZO), zinc tin oxide (ZTO), zinc indium oxide (ZIO), etc.

The semiconductor layer Act may be formed by patterning a preliminary semiconductor layer (not shown). FIGS. 6A and 6B illustrate the semiconductor layer Act including the oxide semiconductor. However, in some embodiments, the preliminary semiconductor layer may include amorphous silicon or polysilicon. Hereinafter, descriptions are given based on a case in which the semiconductor layer Act includes an oxide semiconductor, according to an embodiment. The preliminary semiconductor layer may be deposited by using CVD.

Figure 7A:
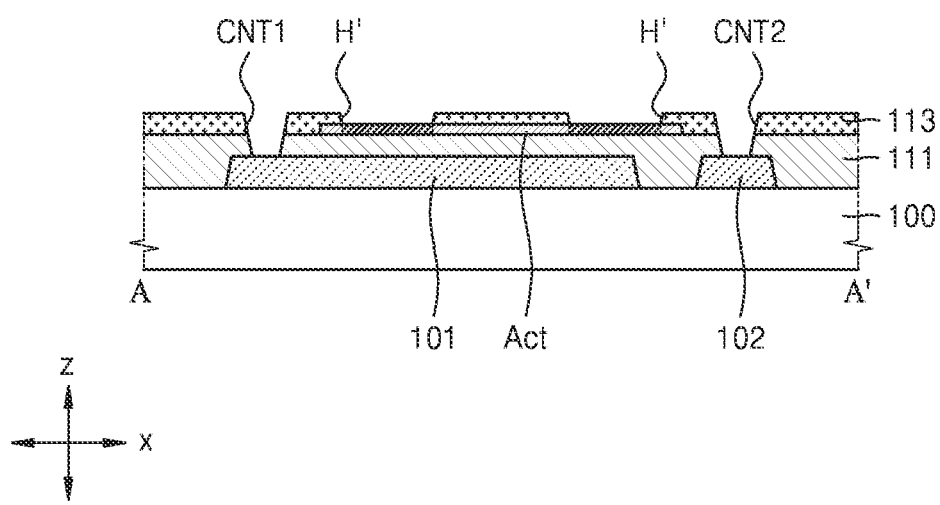
Figure 7B:
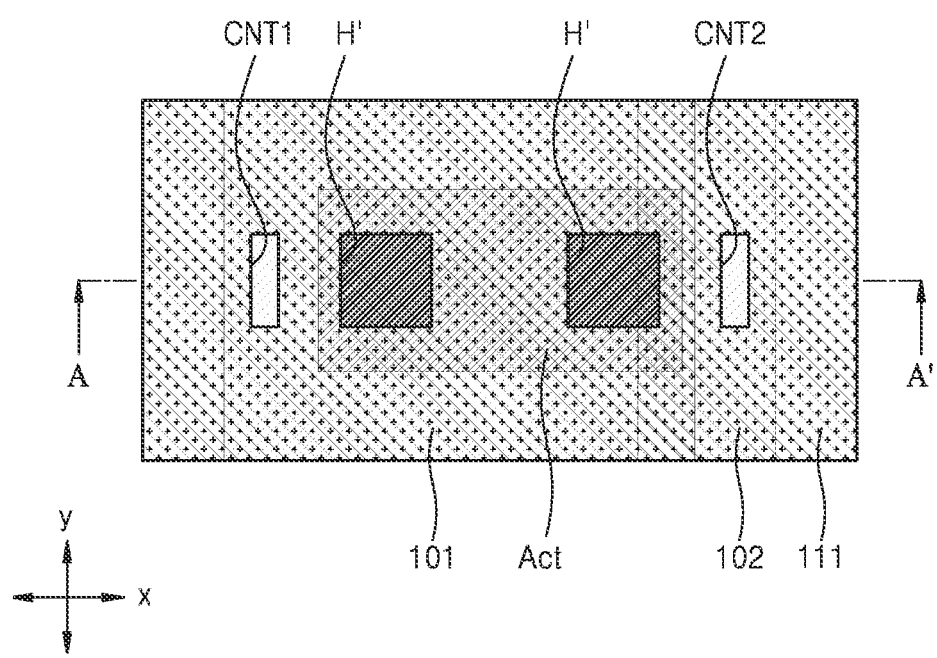

Referring to FIGS. 7A and 7B, a gate insulating layer 113 may be formed on the semiconductor layer Act. The gate insulating layer 113 may include $SiO_x$, $SiN_x$, SiON, $Al_2O_3$, $TiO_2$, $TA_2O_5$, $HfO_2$, $ZnO_2$, etc. and may be formed by using the deposition method such as CVD, sputtering, etc. However, the gate insulating layer 113 is not limited thereto.

The gate insulating layer 113 may include holes H' overlapping the semiconductor layer Act (, e.g., in the z direction or a plan view). At least one insulating layer (for example, the buffer layer 111 and the gate insulating layer 113) arranged on the first lower electrode 101 and the second lower electrode 102 may include a first contact hole CNT1 not overlapping the semiconductor layer Act and overlapping the first lower electrode 101 and a second contact hole CNT2 not overlapping the semiconductor layer Act and overlapping the second lower electrode 102. The first contact hole CNT1 and the second contact hole CNT2 may be formed to penetrate the buffer layer 111 and the gate insulating layer 113.

The first lower electrode 101 may be at least partially exposed by the first contact hole CNT1, the second lower electrode 102 may be at least partially exposed by the second contact hole CNT2, and a portion of the semiconductor layer Act may be at least partially exposed by holes H'. The portion of the semiconductor layer Act exposed by the holes H' may be made conductive by undergoing a plasma process, etc., and as illustrated in FIG. 8A, the semiconductor layer Act may include a source area S and a drain area D that are conductive.

For example, the plasma process refers to a process in which particles being in a plasma state and having high energy collide with a surface of a material to chemically or physically change the surface of the material. According to an embodiment, during the plasma process, at least one selected from the group including hydrogen gas, argon gas, helium gas, xenon gas, nitrogen gas, $SiN_x$ gas, nitrogen oxide gas, oxygen gas, and a mixture thereof may be used.

In case that an oxide semiconductor is plasma-processed, the oxide semiconductor may be reduced, and thus, oxygen defects included in the oxide semiconductor may be induced to increase an oxygen vacancy. The oxide semiconductor having an increased oxygen vacancy may have an increased carrier concentration, and thus, a threshold voltage (which is a critical voltage at which conductivity, one of the characteristics of the semiconductor, is generated) may have a concentration to be shifted in a negative direction. This denotes that the oxide semiconductor becomes conductive to be highly electrically conductive.

Figure 8A:
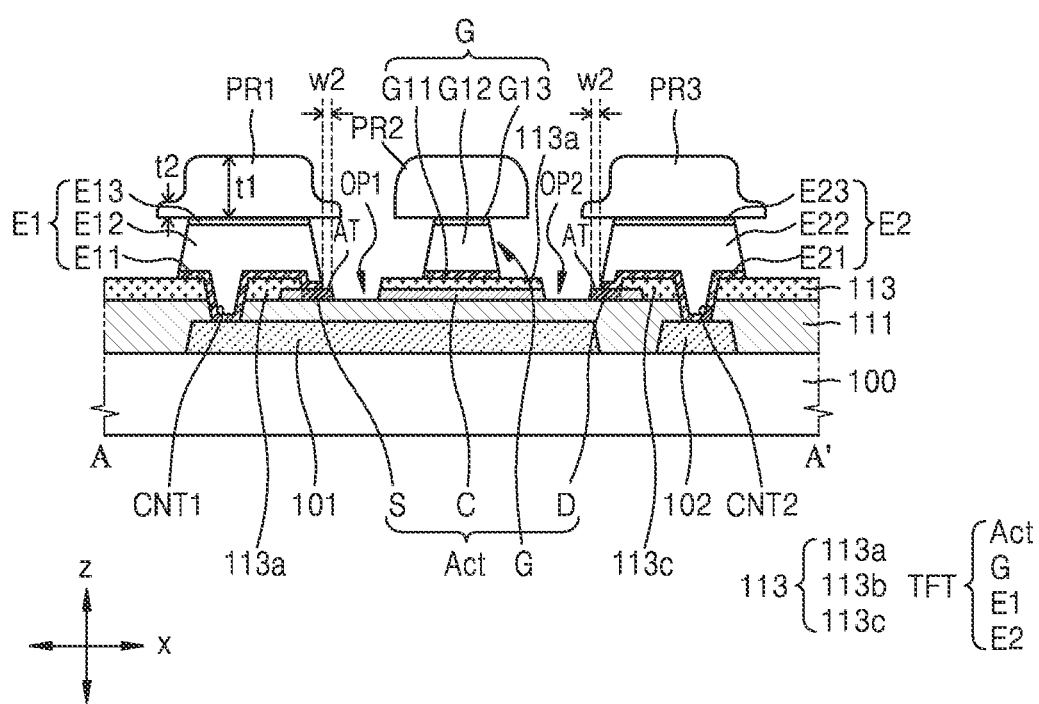
Figure 8B:
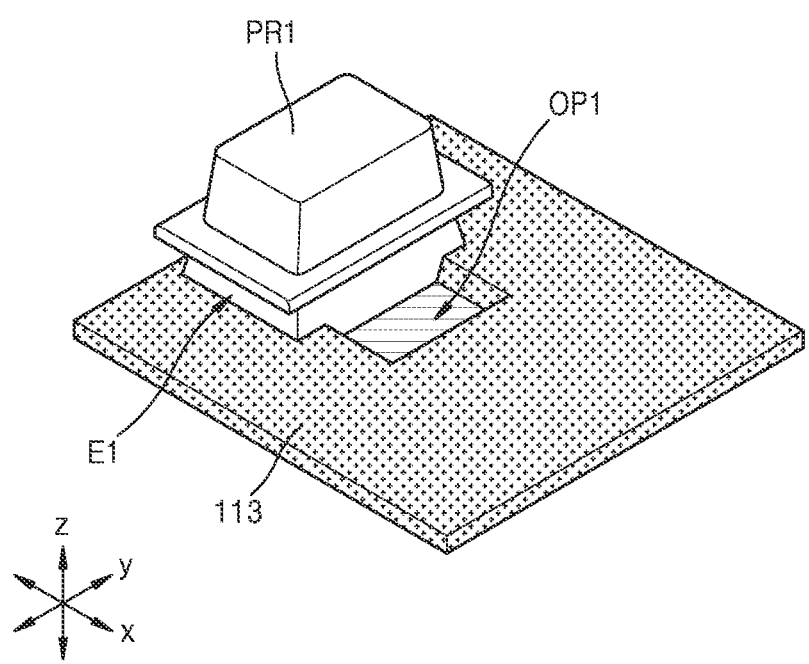
FIG. 8B is a schematic perspective view of a portion of the display apparatus of FIG. 8A.

Referring to FIGS. 8A and 8B, a first electrode E1, a second electrode E2, and a gate electrode G may be formed on the gate insulating layer 113. The first electrode E1, the second electrode E2, and the gate electrode G may be formed by forming a preliminary electrode layer (not shown) and patterning the preliminary electrode layer by using a first photoresist PR1, a second photoresist PR2, and a third photoresist PR3. The preliminary electrode layer may be formed by using a deposition method, such as plasma enhanced CVD (PECVD), low pressure CVD (LPCVD), physical vapor deposition (PVD), sputtering, atomic layer deposition (ALD), etc.

The preliminary electrode layer may include a single conductive layer or conductive layers. According to an embodiment, the preliminary electrode layer may include a first sub-preliminary electrode layer, a second sub-preliminary electrode layer on the first sub-preliminary electrode, and a third sub-preliminary electrode layer on the second sub-preliminary electrode layer, having different metals. According to an embodiment, the first sub-preliminary electrode layer and the second sub-preliminary electrode layer may include a conductive material including Al, Pt, Pd, Ag, Mg, Au, Ni, Nd, Ir, Cr, Li, Ca, Mo, Ti, W, and/or Cu. The third sub-preliminary electrode layer may include a transparent conductive material. The transparent conductive material may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO).

Hereinafter, a case in which the preliminary electrode layer includes three sub-preliminary electrode layers is described. The first electrode E1, the second electrode E2, and the gate electrode G formed by patterning the preliminary electrode layer may include first electrode layers E11, E21, and G11, second electrode layers E12, E22, and G12 on the first electrode layers E11, E21, and G11, and third electrode layers E13, E23, and G13 on the second electrode layers E12, E22, and G12, respectively, as illustrated in FIG. 8A. According to an embodiment, each of the first electrode layers E11, E21, and G11 may include Ti, each of the second electrode layers E12, E22, and G12 may include Cu, and each of the third electrode layers E13, E23, and G13 may include ITO. The first electrode layers E11, E21, and G11, the second electrode layers E12, E22, and G12, and the third electrode layers E13, E23, and G13 included in the first electrode E1, the second electrode E2, and the gate electrode G2, respectively, may correspond to patterned portions of the first to third sub-preliminary electrode layers of the preliminary electrode layer.

In case that the preliminary electrode layer includes the three sub-preliminary electrode layers according to the embodiment described above, the third electrode layers E13, E23, and G13 may prevent or reduce damage to the second electrode layers E12, E22, and G12, respectively, during the manufacturing process of a display apparatus. According to an embodiment, in case that each of the second electrode layers E12, E22, and G12 has chemical resistance, the third electrode layers E13, E23, and G13 may be omitted.

As described above, a photoresist pattern may be formed on the preliminary electrode layer described above, and the first electrode E1, the second electrode E2, and the gate electrode G may be patterned by using the photoresist pattern. The photoresist pattern may be formed by applying a photoresist layer and performing an exposure and development process thereon.

The photoresist pattern may include the first photoresist PR1 corresponding to a portion in which the first electrode E1 is to be formed, the second photoresist PR2 corresponding to a portion in which the gate electrode G is to be formed, and the third photoresist PR3 corresponding to a portion in which the second electrode E2 is to be formed. The first photoresist PR1 and the second photoresist PR2 may have different shapes, and the third photoresist PR3 and the first photoresist PR1 may have substantially a same shape. For example, the third photoresist PR3 may be symmetrical with the first photoresist PR1 with respect to the second photoresist PR2.

Different types of masks may be used for the first photoresist PR1 and the second photoresist PR2, in case that the first photoresist PR1 and the second photoresist PR2 are exposed. As illustrated in FIG. 8B, edge portions of side surfaces of the first photoresist PR1 in four directions may be formed by applying a halftone mask or a slit. Thus, while a thickness of an inner portion of the first photoresist PR1 may be relatively great, a thickness t2 of the edge portion (an edge portion entirely surrounding the inner portion) of the first photoresist PR1 may be relatively little. The thickness t2 of the edge portion of the first photoresist PR1 may be less than a thickness t1 of a central portion of the first photoresist PR1.

Unlike the first photoresist PR1, the second photoresist PR2 may be formed by using a full tone mask. Thicknesses of a central portion and an edge portion of the second photoresist PR2 may be relatively constant.

After the first to third photoresists PR1 to PR3 are formed, the gate electrode G, the first electrode E1, and the second electrode E2 may be formed by etching portions of the preliminary electrode layer described above, the portions not being protected by the first to third photoresists PR1 to PR3. The etching may be a wet etching. Etching may be performed twice or more with different etchants or may be performed only once by using an identical etchant.

During the etching (for example, wet etching) described above, a portion of the conductive area of the semiconductor layer Act may be etched together, and thus, opening portions OP1 and OP2 may be formed in the semiconductor layer Act. The opening portions OP1 and OP2 may be arranged at both sides of a channel area C. The opening portion OP1 (hereinafter referred to as a first opening portion) may be arranged between the channel area C and the first electrode E1 to be adjacent to the first electrode E1, and the opening portion OP2 (hereinafter referred to as a second opening portion) may be arranged between the channel area C and the second electrode E2 to be adjacent to the second electrode E2. The opening portions OP1 and OP2 may be formed to penetrate an upper surface and a lower surface of the semiconductor layer Act, and thus, the buffer layer 111 may be exposed by the opening portions OP1 and OP2. Portions of the conductive area, the portions not being etched, may overlap the first electrode E1 and the second electrode E2. Tail areas AT not overlapping the first electrode E1 and the second electrode E2 may be electrically connected to the portion of the semiconductor layer Act, the portion becoming conductive in a sequential process.

Figure 9A:
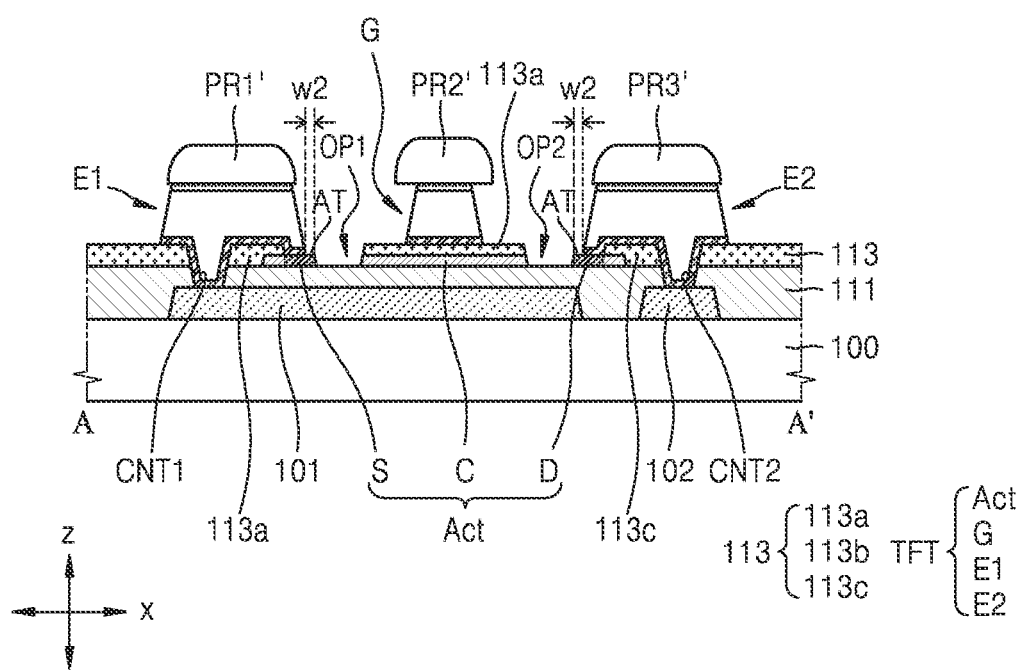
Figure 9B:
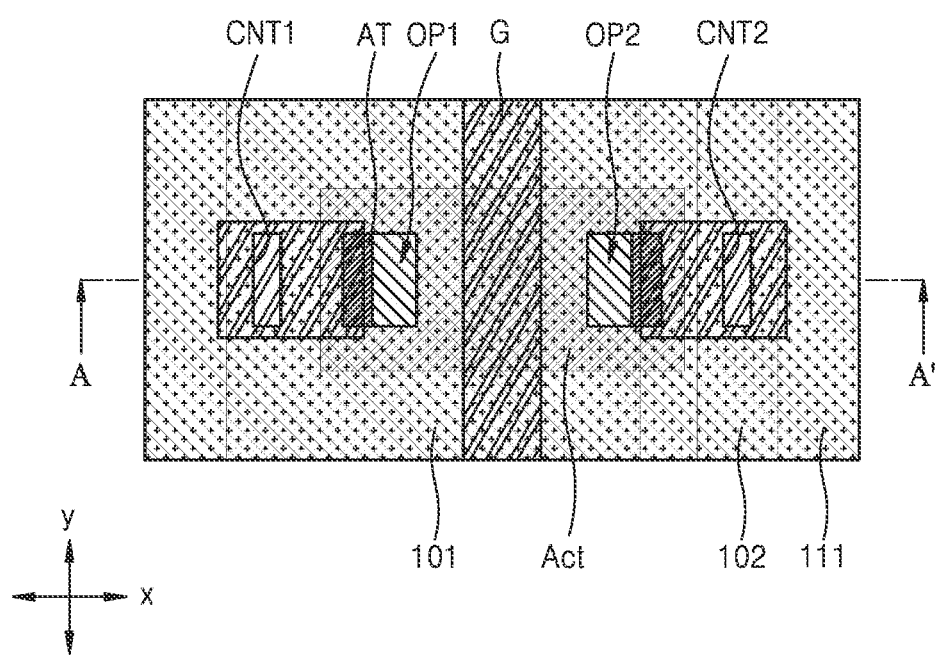

As described with reference to FIGS. 8A and 8B, after forming the first electrode E1, the second electrode E2, and the gate electrode G, the first to third photoresists PR1 to PR3 may be ashed as illustrated in FIGS. 9A and 9B. By ashing, edge portions of the first to third photoresists PR1 to PR3 illustrated in FIGS. 8A and 8B may be removed. In other words, by ashing, only inner portions of the first photoresist PR1 and the third photoresist PR3 illustrated in FIGS. 8A and 8B may remain as illustrated in FIGS. 9A and 9B. Hereinafter, in order to distinguish the photoresists after ashing from the photoresists before ashing, the first and third photoresists PR1 and PR3 that are ashed are referred to as a changed first photoresist PR1' and a changed third photoresist PR3', respectively. Widths (or areas) of the changed first photoresist PR1' and the changed third photoresist PR3' may be relatively the same or similar as those of upper surfaces of the first electrode E1 and the second electrode E2, respectively.

However, the second photoresist PR2 illustrated in FIG. 8A may have a relatively constant thickness, and thus, even in case that ashing is performed, only a width (or an area) of the second photoresist PR2 may be reduced, and a cross-sectional shape of the photoresist PR2 after ashing may be substantially the same as that before ashing, as illustrated in FIG. 9A. Hereinafter, the second photoresist PR2 that is ashed is referred to as a changed second photoresist PR2', for convenience of explanation. Ashing may be performed to such a degree as to remove the edge portions of the first and third photoresists PR1 and PR3, and thus, a width of the changed second photoresist PR2' may be greater than a width of an upper surface of the gate electrode G.

Thereafter, a portion of the gate insulating layer 113 may be etched by using the changed first to third photoresists PR1' to PR3', and the changed first to third photoresists PR1' to PR3' may be removed (for example, stripped) to form a transistor TFT illustrated in FIGS. 10A to 10D. Also, structure of the transistor TFT illustrated in FIGS. 10A to 10D may correspond to at least one of the first to third transistors M1 to M3 described above with reference to FIG. 4.

The etching of the portion of the gate insulating layer 113 by using the changed first to third photoresists PR1' to PR3' may include dry etching. The portion of the gate insulating layer 113 may be etched to form a first insulating pattern 113a, a second insulating pattern 113b, and a third insulating pattern 113c. The first insulating pattern 113a may overlap the first electrode E1, the second insulating pattern 113b may overlap the gate electrode G, and the third insulating pattern 113c may overlap the second electrode E2. The first insulating pattern 113a, the second insulating pattern 113b, and the third insulating pattern 113c may be spatially/physically separated from one another.

Figure 10A:
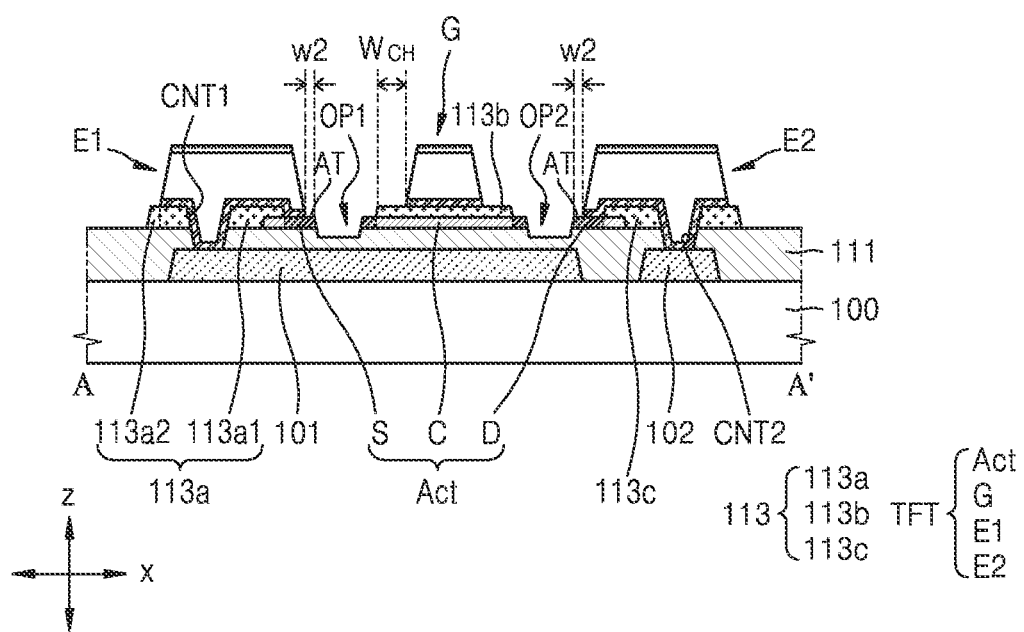
Figure 10B:
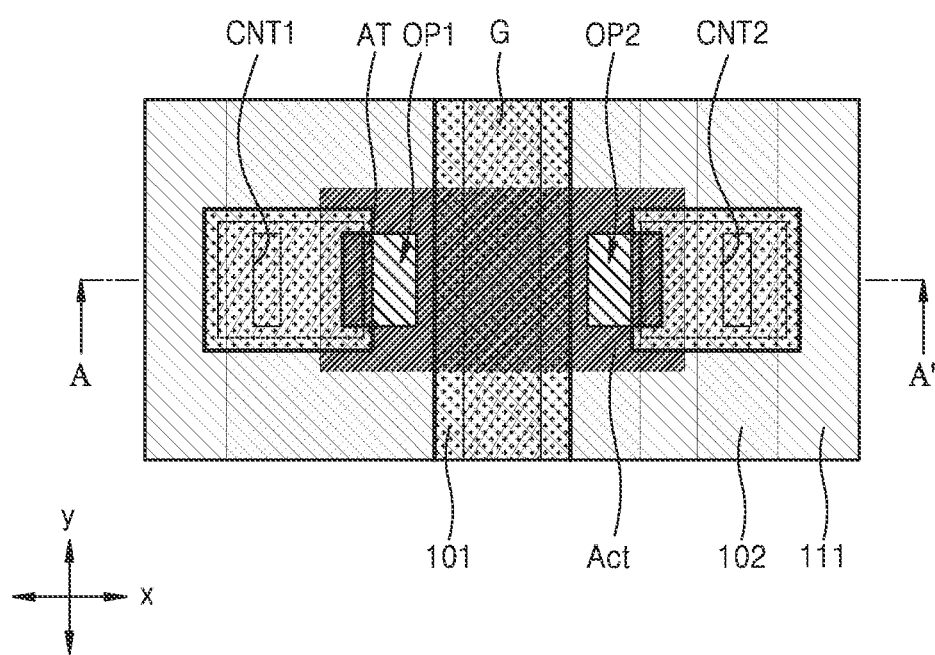

Widths of the first to third insulating patterns 113a to 113c may be affected by widths of lower surfaces of the changed first to third photoresists PR1' to PR3', respectively. For example, unlike the changed first photoresist PR1' and the changed third photoresist PR3', the changed second photoresist PR2' may have an eaves structure protruding in a width direction with respect to the upper surface of the gate electrode G, and thus, the width of the second insulating pattern 113b may be greater than a width of the gate electrode G. Referring to FIG. 10A illustrating the transistor TFT formed according to an embodiment, an edge of the second insulating pattern 113b may have a second width $W_{CH}$ from an edge of the gate electrode G.

During the forming of the first to third insulating patterns 113a to 113c, a plasma process may be performed. According to an embodiment, the first to third insulating patterns 113a to 113c may be patterned by an etching process using a plasma. Here, a portion of the semiconductor layer Act, the portion not being covered by the first to third insulating patterns 113a to 113c but being exposed to the first through third insulating patterns 113a through 113c, may become conductive by the plasma process.

Figure 10C:
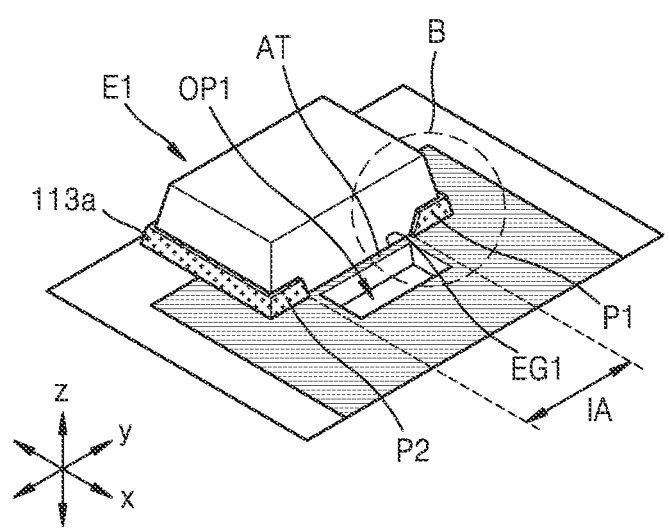
FIG. 10C is a schematic perspective view of a portion of the display apparatus of FIG. 10A.
Figure 10D:
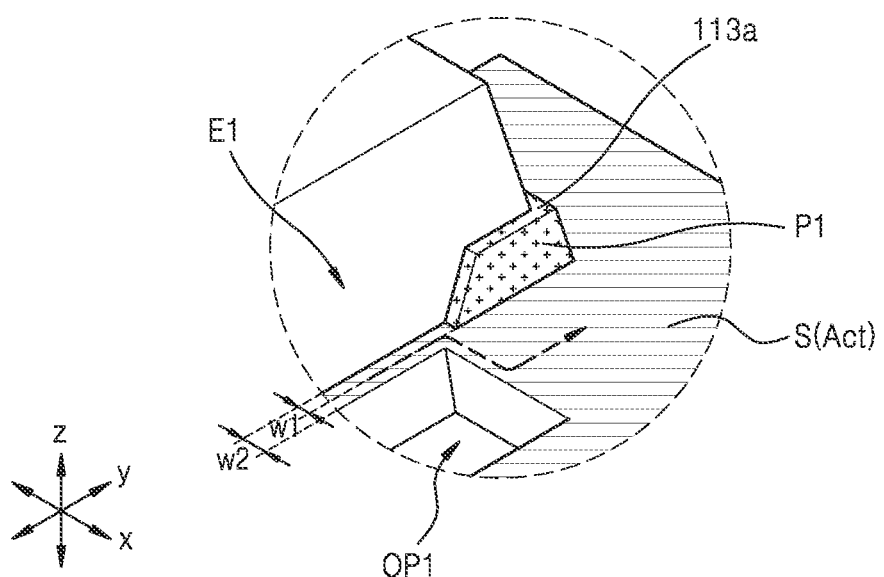
FIG. 10D is a schematic enlarged view of a region B of FIG. 10A.

Referring to FIGS. 10A, 10C, and 10D, the first insulating pattern 113a overlapping the first electrode E1 may include an inner portion 113a1 directly below the first electrode E1 and an edge portion 113a2 outside the inner portion 113a1. The edge portion 113a2 of the first insulating pattern 113a may approximately have a "C" shape in a plan view. According to an embodiment, the edge portion 113a2 of the first insulating pattern 113a may further extend from a lower surface of the first electrode E1 in a width direction (or a direction parallel with an upper surface of the semiconductor layer Act) and may approximately have a "C" shape in a plan view. A spaced area IA adjacent to a first edge EG1 of the first electrode E1 adjacent to the opening portion (for example, the first opening portion OP1) may be provided. The spaced area IA of the edge portion 113a2 of the first insulating pattern 113a may correspond to a portion of the first edge EG1 of the first electrode E1. The first edge EG1 may indicate a lower edge of the first electrode E1 that is most adjacent to the first opening portion OP1.

The edge portion 113a2 of the first insulating pattern 113a may include a first portion P1 and a second portion P2 spaced apart from each other with the spaced area IA therebetween. The first portion P1 may have a first width W1. Here, the first width W1 may be a value measured in a first direction (an x direction) and may correspond to a distance between the first edge EG1 of the first electrode E1 and an edge of a lower surface of the edge portion 113a2 of the first insulating pattern 113a. The first direction (the x direction) may indicate a direction from the first edge EG1 of the first electrode E1 toward the first opening portion OP1. As another example, the first direction (the x direction) may indicate a direction from the first edge EG1 of the first electrode E1 toward the channel area C.

The tail area AT of the semiconductor layer Act, which is conductive, may be provided between the first electrode E1 and the first opening portion OP1. In other words, a portion of the semiconductor layer Act, the portion overlapping the spaced area IA, may be the conductive tail area AT. The tail area AT may have a second width W2 in the first direction (the x direction). The first width W1 of each of the first portion P1 and the second portion P2 may be less than the second width W2 of the tail area AT. Thus, a conductive path (see a dashed arrow in FIG. 10D) electrically connecting the tail area AT adjacent to the first electrode E1 with another conductive area of the semiconductor layer Act may be stably formed.

The second width W2 of the tail area AT may be greater than or equal to about 0.2 µm, and in some embodiments, the second width W2 may be greater than or equal to about 0.5 µm. The first width W1 of each of the first portion P1 and the second portion P2 may be greater than about 0 or less than about 0.5 µm. In some embodiments, the first width W1 may be less than about 0.2 µm.

According to the process described above with reference to FIG. 8A, the first photoresist PR1 and the third photoresist PR3 may have a different shape from the second photoresist PR2. For example, the first photoresist PR1 and the third photoresist PR3 may include an edge portion having a different thickness from an inner portion, because of a halftone mask, etc.

However, according to a comparative embodiment, in case that the first photoresist PR1 the third photoresist PR3, and the second photoresist PR2 are formed by using a same mask, and thus, have a same shape, an ion drop phenomenon may occur in a semiconductor layer. According to the comparative embodiment, in case that the first to third photoresists PR1 to PR3 are exposed, a full tone mask may be used. Also, before the gate insulating layer 113 is etched, ashing of the first to third photoresists PR1 to PR3 may be omitted. The first photoresist PR1 and the third photoresist PR3 according to the comparative embodiment do not include the edge portion having a relatively small thickness, unlike the first and third photoresists PR1 and PR3 illustrated in FIG. 8A, and thus, the first and third insulating patterns 113a and 113c formed by using the first and third photoresists PR1 and PR3 according to the comparative embodiment may have a greater area than the first and third insulating patterns 113a and 113c described with reference to FIG. 10A. For example, the first and second portions P1 and P2 of the first insulating pattern 113a may be highly proximate to an edge of the first opening portion OP1. In this case, the conducive passage (the dashed arrow of FIG. 10D) described with reference to FIG. 10D may become highly narrow or may be substantially broken, and thus, a contact resistance of the corresponding passage may increase to cause an ion drop phenomenon.

However, according to an embodiment, the first and third photoresists PR1 and PR3 may include the edge portion having a different thickness from the inner portion, because of a halftone mask, a slit, etc. Also, before etching the gate insulating layer 113, the first photoresist PR1 and the third photoresist PR3 may be ashed, and by ashing, the edge portion of the first and third photoresists PR1 and PR3 may be removed as illustrated in FIGS. 8A and 8B. Unlike the comparative embodiment, the first and third insulating patterns 113*a* and 113*c* formed by using the changed first and third photoresists PR1' and PR3' may have a relatively small area. For example, as described with reference to FIG. 10A, the edge portion of the first and third insulating patterns 113*a* and 113*c* may be spaced apart from the first opening portion OP1. Thus, as described with reference to FIG. 10D, the conductive path (the dashed arrow of FIG. 10D) of the semiconductor layer Act adjacent to the electrode (for example, the first electrode E1) may be stably formed, and thus, the ion drop phenomenon of the semiconductor layer may be prevented.

Figure 11:
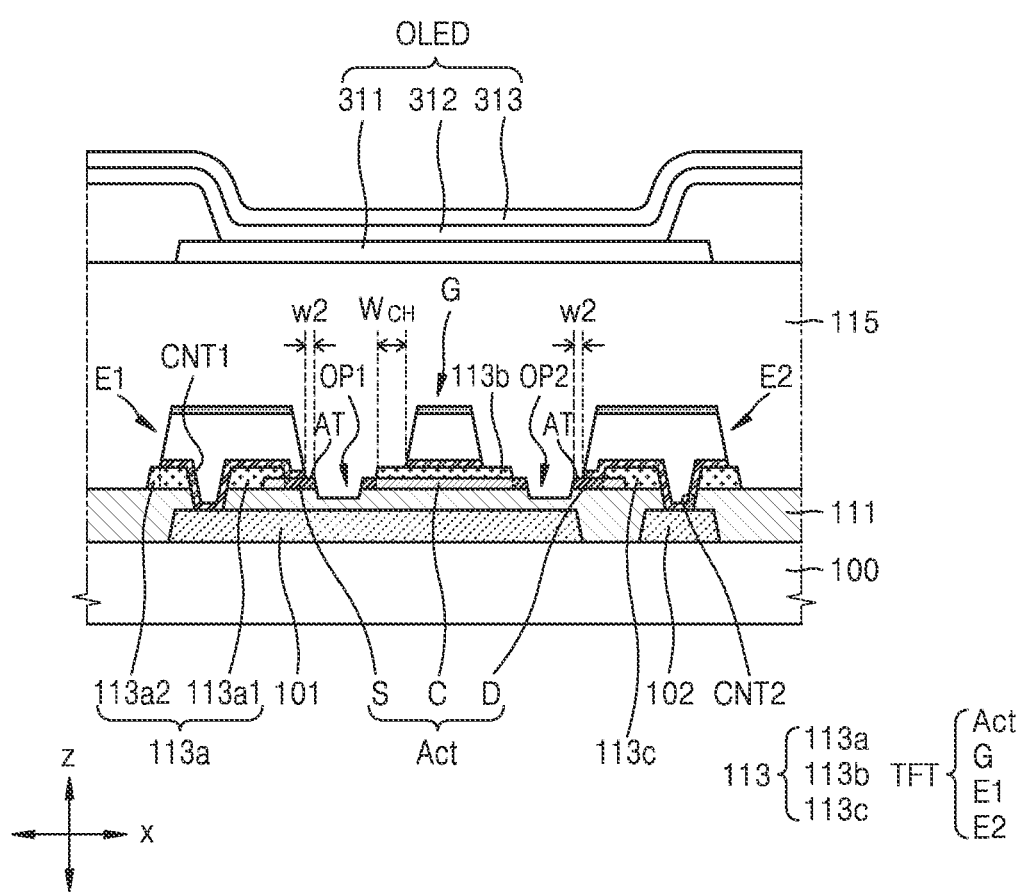
FIG. 11 is a schematic cross-sectional view of a display apparatus according to an embodiment.
Figure 12A:
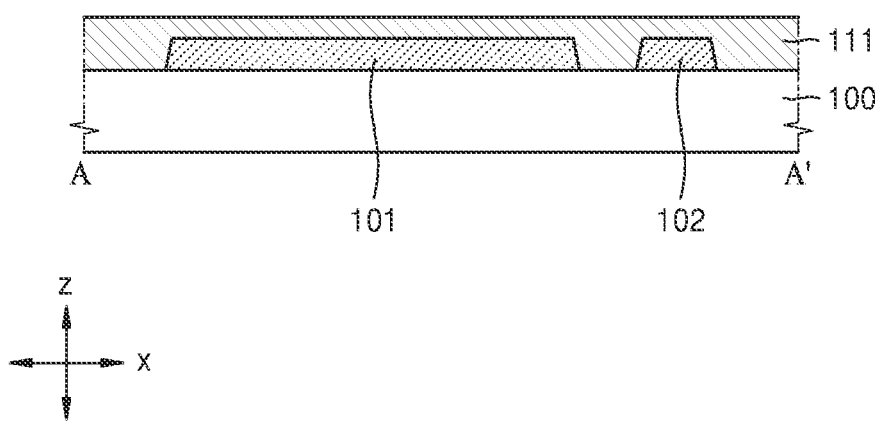
FIGS. 12A, 13A, 14A, 15A, 16A, and 17A are schematic cross-sectional views with respect to a method of manufacturing a display apparatus, according to an embodiment.
Figure 12B:
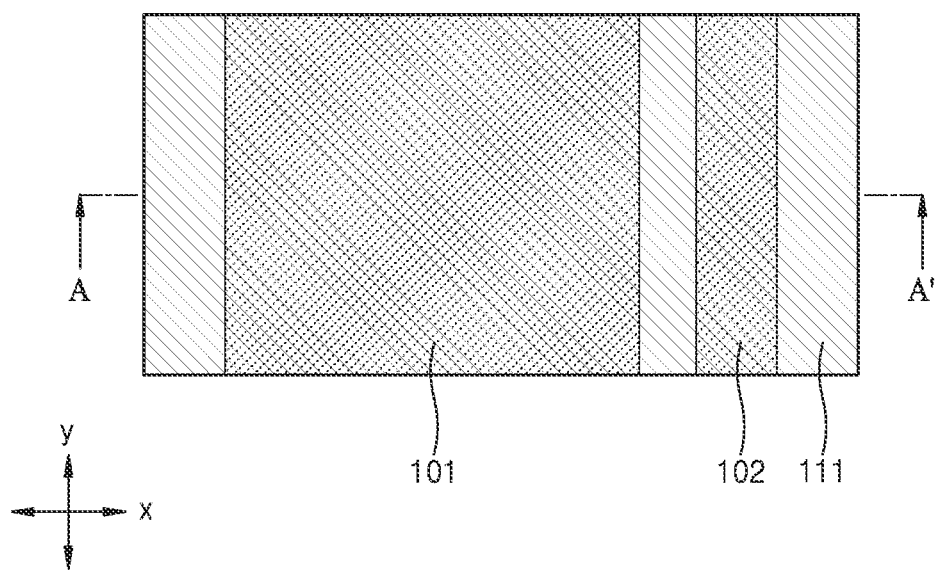
FIGS. 12B, 13B, 14B, 16B, and 17B are schematic plan views of the display apparatus of FIGS. 12A, 13A, 14A, 16A, and 17A, respectively.
Figure 13A:
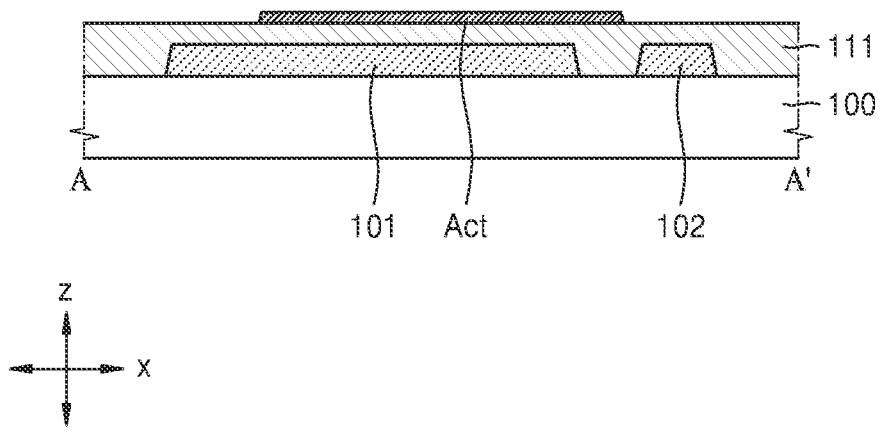
Figure 13B:
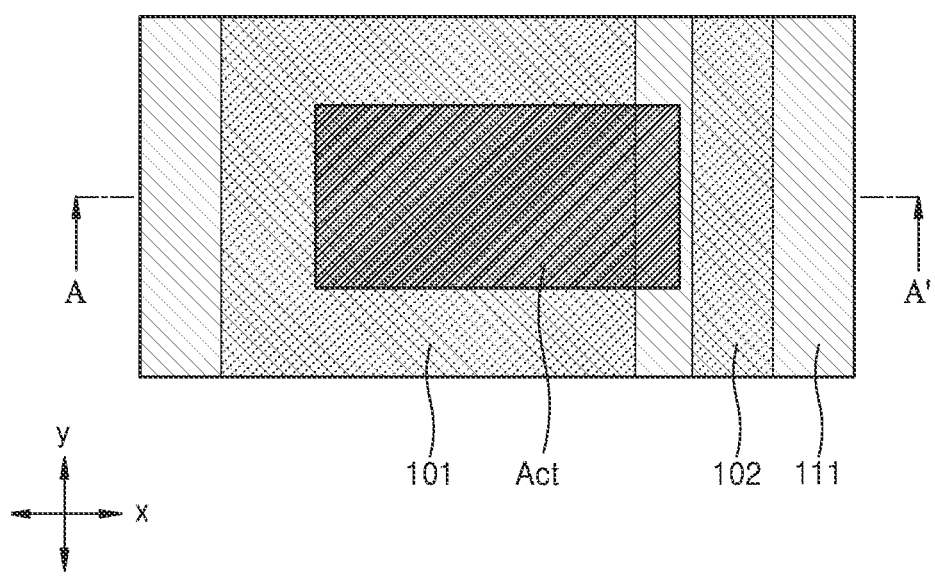
Figure 14A:
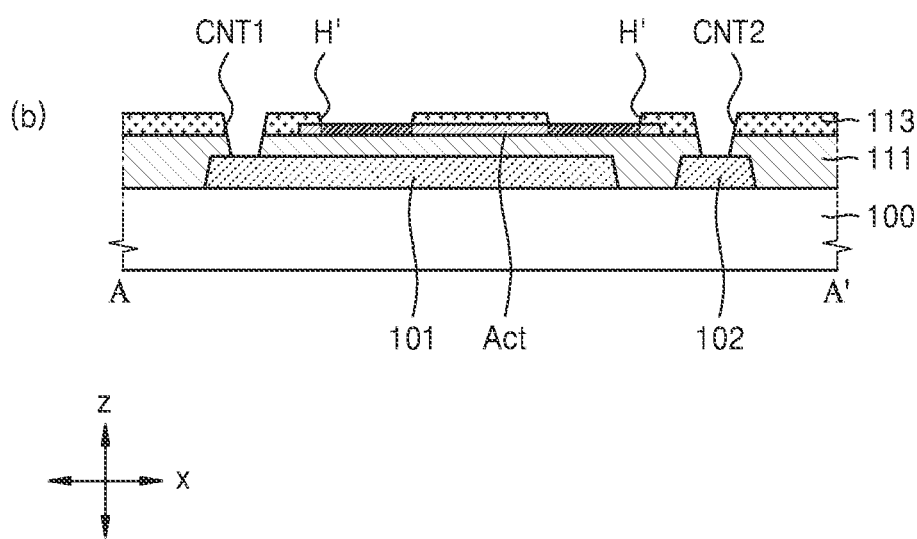
Figure 14B:
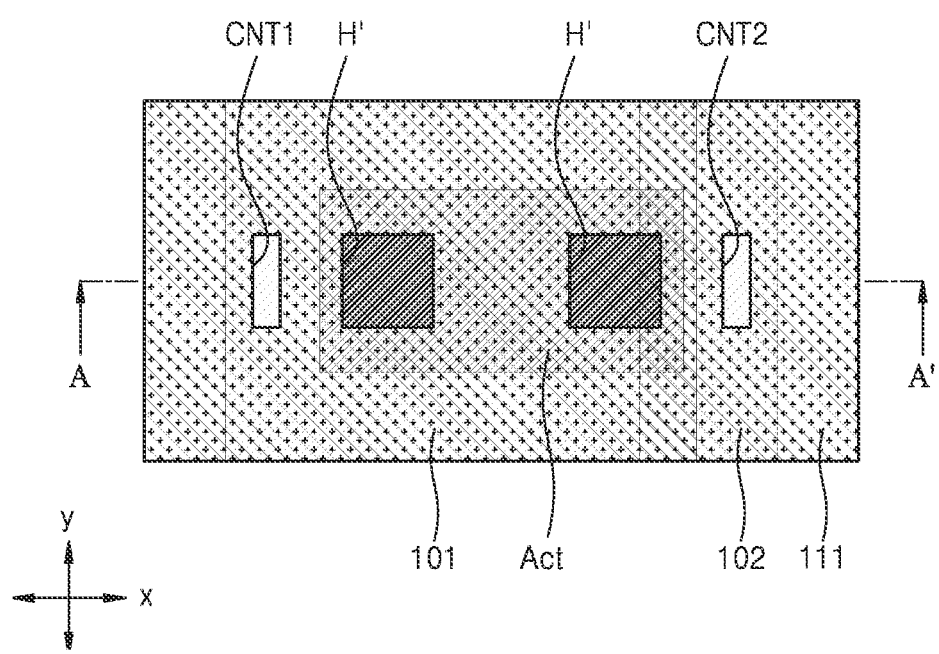

FIG. 11 is a schematic cross-sectional view of a display apparatus DV, manufactured by using a method of manufacturing a display apparatus, according to an embodiment. Hereinafter, components included in the display apparatus DV are described in detail according to an order in which the components are stacked. The structure of the thin-film transistor TFT described with reference to FIGS. 10A to 10D may be likewise applied to a thin-film transistor TFT of FIG. 11.

The display apparatus DV may include the thin-film transistor TFT arranged on the substrate 100 in a display area. The thin-film transistor TFT may include the semiconductor layer Act and the gate electrode G at least partially overlapping the semiconductor layer Act.

The substrate 100 may include a glass material, a ceramic material, a metal material, or a flexible or bendable material. In case that the substrate 100 is flexible or bendable, the substrate 100 may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate.

The substrate 100 may have a single-layered or multi-layered structure, and in case that the substrate 100 has a multi-layered structure, the substrate 100 may further include an inorganic material. In some embodiments, the substrate 100 may have a structure of an organic material/an inorganic material/an organic material.

The buffer layer 111 may be arranged on the substrate 100. A barrier layer (not shown) may further be included between the substrate 100 and the buffer layer 111. The barrier layer may prevent or minimize the penetration of impurities into the semiconductor layer Act from the substrate 100. The barrier layer may include an inorganic material such as an oxide or a nitride, an organic material, or an organic and inorganic compound and may have a single-layered or multi-layered structure including the inorganic material and the organic material.

The first lower electrode 101 and the second lower electrode 102 may be arranged between the substrate 100 and the buffer layer 111. According to an embodiment, each of the first lower electrode 101 and the second lower electrode 102 may include a source electrode, a drain electrode, or a data line.

The first lower electrode 101 may be arranged to overlap the semiconductor layer Act. In case that the semiconductor layer Act includes an oxide semiconductor material, the semiconductor layer Act may be vulnerable to light. Thus, a change in the device characteristics of the thin-film transistor TFT including the oxide semiconductor material, due to photocurrent induced in the semiconductor layer Act by external light that is incident from the substrate 100, may be prevented, through the first lower electrode 101. The semiconductor layer Act may be arranged on the buffer layer 111. The semiconductor layer Act may include an oxide semiconductor. The oxide semiconductor may have a large band gap, a high carrier mobility, and a low leakage current, and thus, even in case that a driving time is increased, a voltage drop may not be large. Thus, a brightness change due to the voltage drop may not be significant even during a low-frequency driving operation.

The gate insulating layer 113 may be arranged on the semiconductor layer Act. The gate insulating layer 113 may include the holes H' overlapping the semiconductor layer Act. The buffer layer 111 and the gate insulating layer 113 may include the first contact hole CNT1 formed to penetrate the buffer layer 111 and the gate insulating layer 113 and overlapping the first lower electrode 101 and the second contact hole CNT2 formed to penetrate the buffer layer 111 and the gate insulating layer 113 and overlapping the second lower electrode 102. A portion of the semiconductor layer Act, the portion being exposed by the holes H', may be made conductive by undergoing a plasma process, etc., and the semiconductor layer Act may include the source area S and the drain area D that are conductive.

The opening portions OP1 and OP2 may be formed in the conductive source area S and drain area D of the semiconductor layer Act. The opening portions OP1 and OP2 may be arranged at both sides of the channel area C. The first opening portion OP1 may be arranged between the channel area C and the first electrode E1 to be adjacent to the first electrode E1, and the second opening portion OP2 may be arranged between the channel area C and the second electrode E2 to be adjacent to the second electrode E2.

The gate insulating layer 113 may be patterned. As illustrated in FIG. 11, the gate insulating layer 113 may include the first insulating pattern 113*a*, the second insulating pattern 113*b*, and the third insulating pattern 113*c* that are spaced apart from each other. The second insulating pattern 113*b* may overlap the channel area C, the first insulating pattern 113*a* may overlap a portion of the source area S, and the third insulating pattern 113*c* may overlap a portion of the drain area D. Each of the first insulating pattern 113*a* and the third insulating pattern 113*c* may cover an end of the semiconductor layer Act.

Portions of the semiconductor layer Act, the portions overlapping the first to third insulating patterns 113*a* to 113*c*, may not be exposed by a plasma process, and thus, may not become conductive, so as to have different properties from the portion of the semiconductor layer Act, the portion being exposed by the plasma process.

A portion of the semiconductor layer Act directly below the first electrode E1 may include a first portion (not shown) having a carrier concentration corresponding to one of the source area S and the drain area D and a second portion (not shown) having a different carrier concentration from the first portion. For example, the second portion may be a portion that is covered by the first insulating pattern 113*a*. The second portion may have a less carrier concentration than the first portion. A material of the second portion may be the same as a material of the channel area C. In other words, similar to the channel area C, the second portion may be a portion that is not conductive. The conductive tail area AT not overlapping the first electrode E1 and being adjacent to the first opening portion OP1 may be electrically connected to another conductive portion of the semiconductor layer Act.

The first electrode E1 may be electrically connected to the first lower electrode 101 through the first contact hole CNT1 formed in the first insulating pattern 113a and the buffer layer 111. The first electrode E1 may be electrically connected to the semiconductor layer Act, and thus, the semiconductor layer Act and the first lower electrode 101 may be electrically connected to each other through the first electrode E1. The first electrode E1 may function as a bridge electrically connecting the semiconductor layer Act with the first lower electrode 101.

The second electrode E2 may be electrically connected to the second lower electrode 102 through the second contact hole CNT2 formed in the third insulating pattern 113c and the buffer layer 111. The second electrode E2 may be electrically connected to the semiconductor layer Act, and thus, the semiconductor layer Act and the second lower electrode 102 may be electrically connected to each other by the second electrode E2. The second electrode E2 may function as a bridge electrically connecting the semiconductor layer Act with the second lower electrode 102.

Referring to FIG. 11, an upper insulating layer 115 may be arranged to cover the first electrode E1, the second electrode E2, and the gate electrode G. The upper insulating layer 115 may include an inorganic insulating layer including an inorganic material. For example, the upper insulating layer 115 may include polysiloxane, $SiN_x$, SiON, etc. The upper insulating layer 115 may include a single layer or multiple layers including $SiN_x$ and $SiO_x$. In some embodiments, the upper insulating layer 115 may include a single layer or multiple layers including an organic material. The upper insulating layer 115 may include, for example, benzocyclobutene (BCB), polyimide, hexamethyldisiloxane (HMDSO), polymethylmethacrylate (PMMA), or a general-purpose polymer such as polystyrene (PS), a polymer derivate having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof. The upper insulating layer 115 may include a single layer or multiple layers including the materials described above.

A light-emitting device may be arranged on the upper insulating layer 115. The light-emitting device may include a pixel electrode 311, an intermediate layer 312 including an organic emission layer, and an opposite electrode 313. According to an embodiment, the light-emitting device may include an organic light-emitting diode OLED. Hereinafter, the light-emitting device is described as the organic light-emitting diode OLED.

The pixel electrode 311 may include a transflective electrode or a reflection electrode. In some embodiments, the pixel electrode 311 may include a reflective layer including Ag, Mg, Al, Pt, Pd, Au, Ni, Nd, Ir, Cr, and a compound thereof and a transparent or semi-transparent electrode layer on the reflective layer. The pixel electrode 311 may include a transparent or semi-transparent electrode layer including ITO, IZO, ZnO, $In_2O_3$, IGO, or AZO. The pixel electrode 311 may include a single layer, a double layer, or a multi-layer.

A pixel-defining layer (not shown), which is an organic layer, may be arranged on the upper insulating layer 115. The pixel-defining layer may cover an edge of the pixel electrode 311 and may have an opening exposing a portion of the pixel electrode 311. The pixel-defining layer may increase a distance between the edge of the pixel electrode 311 and the opposite electrode 313 above the pixel electrode 311 so as to prevent arcs, etc. from occurring at the edge of the pixel electrode 311.

The pixel-defining layer may be formed by spin coating, etc., by including at least one organic insulating material selected from the group consisting of polyimide, polyamide, acryl resins, BCB, and phenol resins.

The intermediate layer 312 may be arranged in the opening defined by the pixel-defining layer and may include an organic emission layer. The organic emission layer may include an organic material including a fluorescent or phosphorescent material for emitting red, green, blue, or white light. The organic emission layer may include a low molecular-weight organic material or a high molecular-weight organic material. Also, a functional layer such as a hole transport layer (HTL), a hole injection layer (HIL), an electron transport layer (ETL), and an electron injection layer (EIL) may be selectively further arranged above and below the organic emission layer.

The opposite electrode 313 may include a transmissive electrode or a reflection electrode. In some embodiments, the opposite electrode 313 may include a transparent or semi-transparent electrode and may include a metal thin-film having a low work function, such as Li, Ca, LiF/Ca, LiF/Al, Al, Ag, Mg, and a compound thereof. Also, a transparent conductive oxide (TCO) layer including ITO, IZO, ZnO, $In_2O_3$, etc., may further be arranged above the metal thin-film. The opposite electrode 313 may be arranged throughout the display area DA and may be arranged above the intermediate layer 312 and the pixel-defining layer. The opposite electrode 313 may be integrally formed with respect to light-emitting diodes OLED and may correspond to pixel electrodes 311.

FIGS. 12A, 13A, 14A, 15A, 16A, and 17A are schematic cross-sectional views of a method of manufacturing a display apparatus, according to an embodiment. FIGS. 12B, 13B, 14B, 16B, and 17B are schematic plan views of the display apparatus of FIGS. 12A, 13A, 14A, 16A, and 17A, and FIG. 15B is a schematic perspective view of a portion of the display apparatus of FIG. 15A. FIGS. 12A, 13A, 14A, 16A, and 17A correspond to cross-sections taken along line A-A' of FIGS. 12B, 13B, 14B, 16B, and 17B.

Reference numerals used in FIGS. 12A, 13A, 14A, 15A, 16A, 17A, 17B, and 17C that are the same as the reference numerals used in FIGS. 5A, 6A, 7A, 8A, 9A, 10A, 10B, 10C, and 10D denote the same members, and thus, repetitive descriptions thereof are omitted.

FIGS. 12A, 13A, 14A, 15A, 16A, and 17A correspond to an embodiment, in which one or more aspects of FIGS. 5A, 6A, 7A, 8A, 9A, and 10A are modified, and thus, hereinafter, descriptions are to be given based on differences.

Referring to FIGS. 12A to 14B, first, the first lower electrode 101 and the second lower electrode 102 may be formed on the substrate 100, and the buffer layer 111 may be formed on the first lower electrode 101 and the second lower electrode 102. The semiconductor layer Act may be arranged on the buffer layer 111. The semiconductor layer Act may include an oxide semiconductor. The gate insulating layer 113 may be formed on the semiconductor layer Act.

The first contact hole CNT1, the second contact hole CNT2, and the holes H' may be formed in the buffer layer 111 and the gate insulating layer 113. A portion of the semiconductor layer Act, the portion being exposed by the holes H', may become conductive by a plasma process, etc.

Figure 15A:
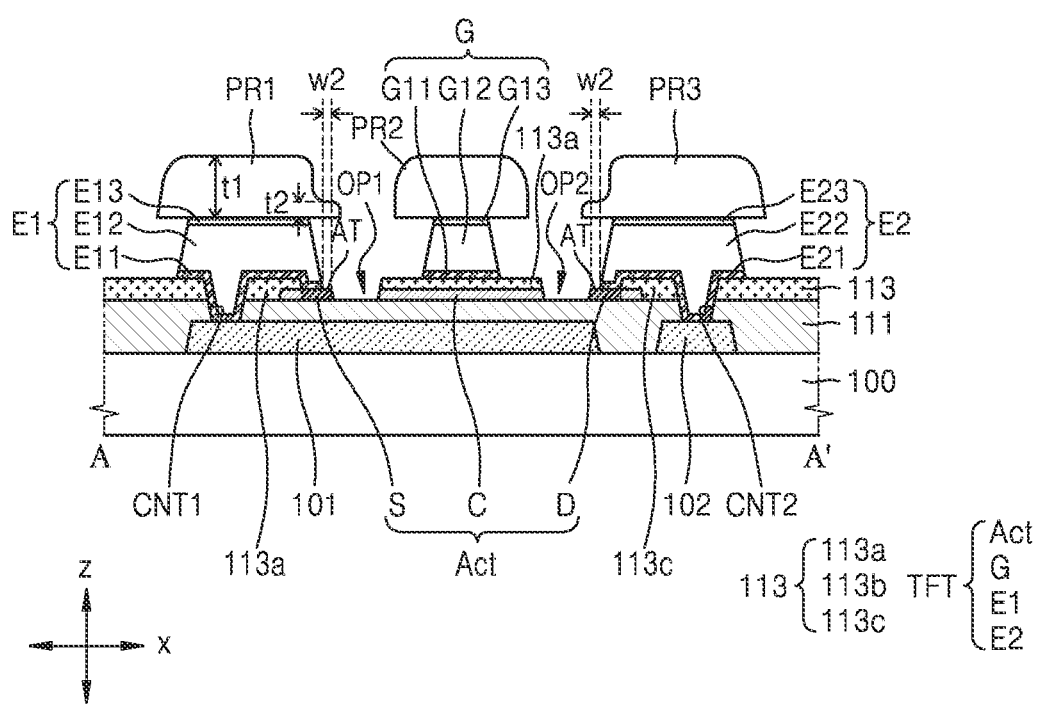
Figure 15B:
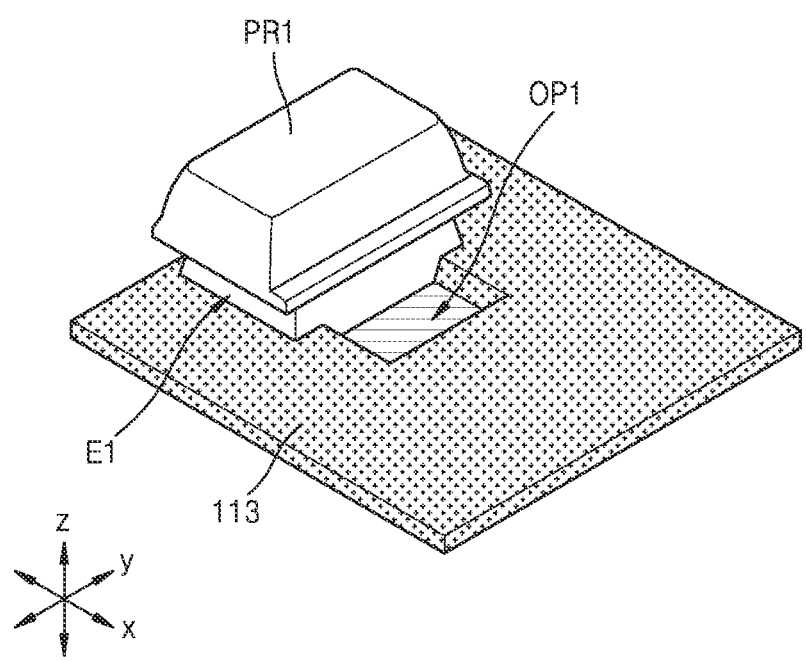
FIG. 15B is a schematic perspective view of a portion of the display apparatus of FIG. 15A.

Referring to FIGS. 15A and 15B, the first electrode E1, the second electrode E2, and the gate electrode G may be formed on the gate insulating layer 113. The first electrode E1, the second electrode E2, and the gate electrode G may be formed by forming a preliminary electrode layer (not shown) and patterning the preliminary electrode layer by using the first to third photoresists PR1 to PR3.

In case that the first photoresist PR1 and the second photoresist PR2 are exposed, different types of masks may be used. Unlike described with reference to FIGS. 8A and 8B, the first photoresist PR1 and the third photoresist PR3 illustrated in FIG. 15B may be formed by applying a halftone mask or a slit to only an edge portion of a side surface of the first photoresist PR1, the side surface being in a first direction (an x direction) toward the channel area C. In some embodiments, the halftone mask or the slit may be additionally applied to an edge portion of another side surface of the first photoresist PR1, except the side surface of the first photoresist PR1, the side surface being in the first direction toward the channel area C of the semiconductor layer Act. Thus, while a thickness of an inner portion of the first photoresist PR1 may be relatively great, a thickness of an edge portion of at least one side surface of the first photoresist PR1 may be relatively small. For example, a thickness t2 of the edge portion of the side surface of the first photoresist PR1, the side surface being in the first direction (the x direction) toward the channel area C may be less than a thickness t1 of a central portion of the first photoresist PR1.

Unlike the first photoresist PR1, the second photoresist PR2 may be formed by using a full tone mask, and the second photoresist PR2 may have a central portion and an edge portion having a relatively constant thickness.

After the first to third photoresists PR1 to PR3 are formed, portions of the preliminary electrode layer described above, the portions not being protected by the first to third photoresists PR1 to PR3, may be etched to form the gate electrode G, the first electrode E1, and the second electrode E2.

Figure 16A:
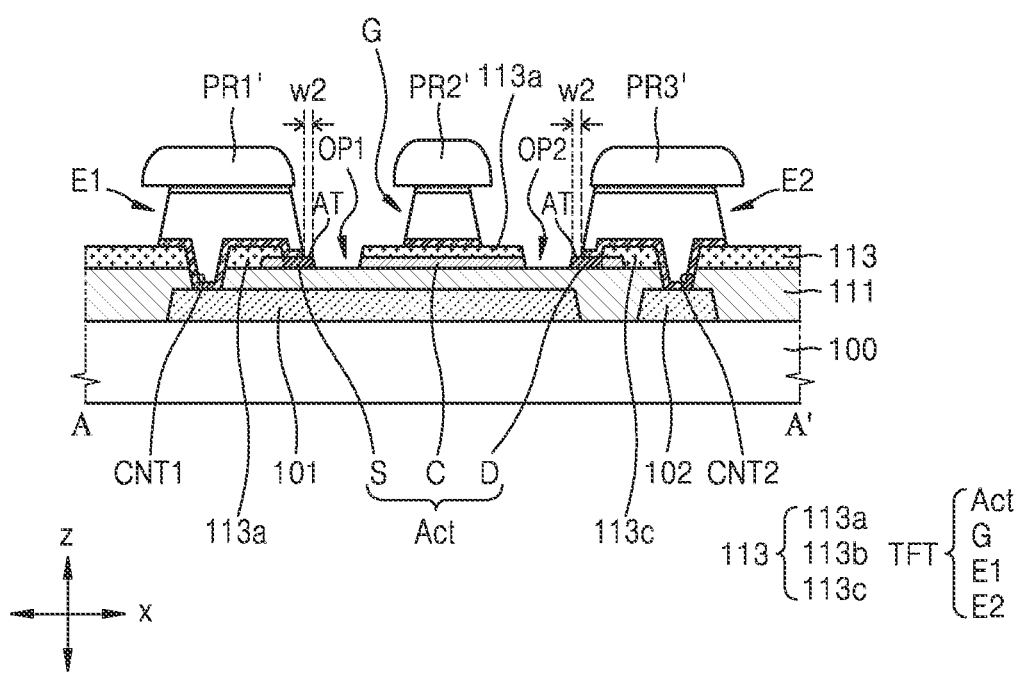
Figure 16B:
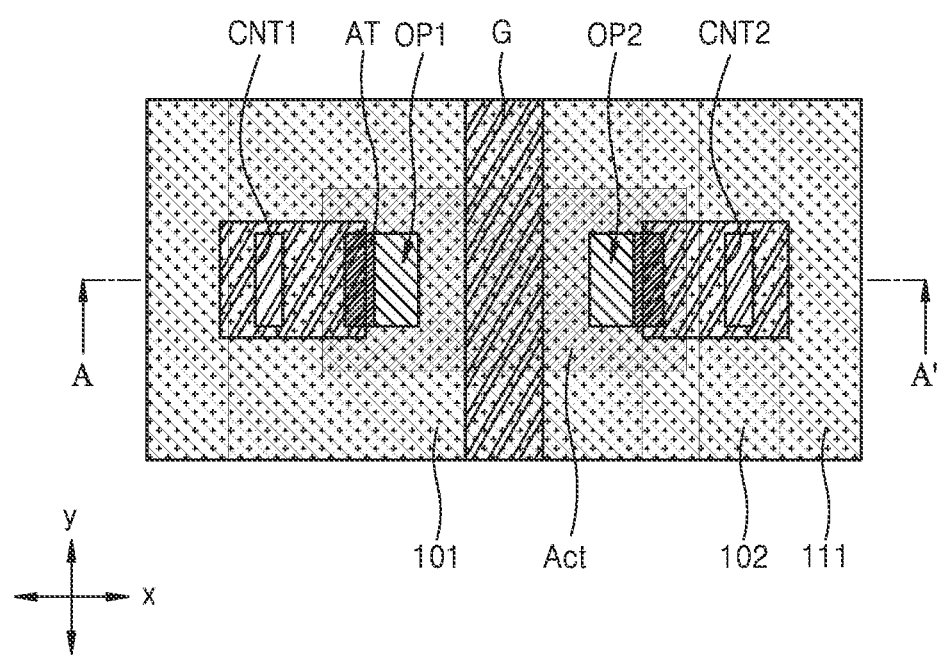

As illustrated in FIGS. 16A and 16B, the first electrode E1, the second electrode E2, and the gate electrode G are formed, and the first to third photoresists PR1 to PR3 may be ashed as illustrated in FIGS. 9A and 9B. The edge portion of the side surface of the first and third photoresists PR1 and PR3, the side surface being in the first direction (the x direction) toward the channel area C, as illustrated in FIG. 15A, may be removed by ashing. In other words, the inner portion of the first and third photoresists PR1 and PR3 illustrated in FIGS. 15A and 15B and an edge portion of each of the first and third photoresists PR1 and PR3, except for the edge portion of the side surface in the first direction toward the channel area C that is removed by ashing, may remain as illustrated in FIGS. 16A and 16B. Widths (or areas) of the changed first photoresist PR1' and the changed third photoresist PR3' in FIG. 16A may be relatively greater than the widths (or the areas) of the changed first photoresist PR1' and the changed third photoresist PR3' in FIG. 9A. However, because the edge portion of the side surface of the changed first photoresist PR1', the side surface being in the first direction toward the channel area C, is removed, an edge of the edge portion of the changed first photoresist PR1' in the first direction toward the channel area C may be relatively proximate to an upper edge of the first electrode E1 that is most adjacent to the first opening portion OP1 of the first electrode E1. The changed third photoresist PR3' may be symmetrical to the changed first photoresist PR1' with respect to the channel area C.

Thereafter, a portion of the gate insulating layer 113 may be etched by using the changed first to third photoresists PR1' to PR3', and the changed first to third photoresists PR1' to PR3' may be removed (for example, stripped) to form the first to third insulating patterns 113a to 113c. Widths of the first to third insulating patterns 113a to 113c may be affected by widths of lower surfaces of the changed first to third photoresists PR1' to PR3', respectively.

Figure 17A:
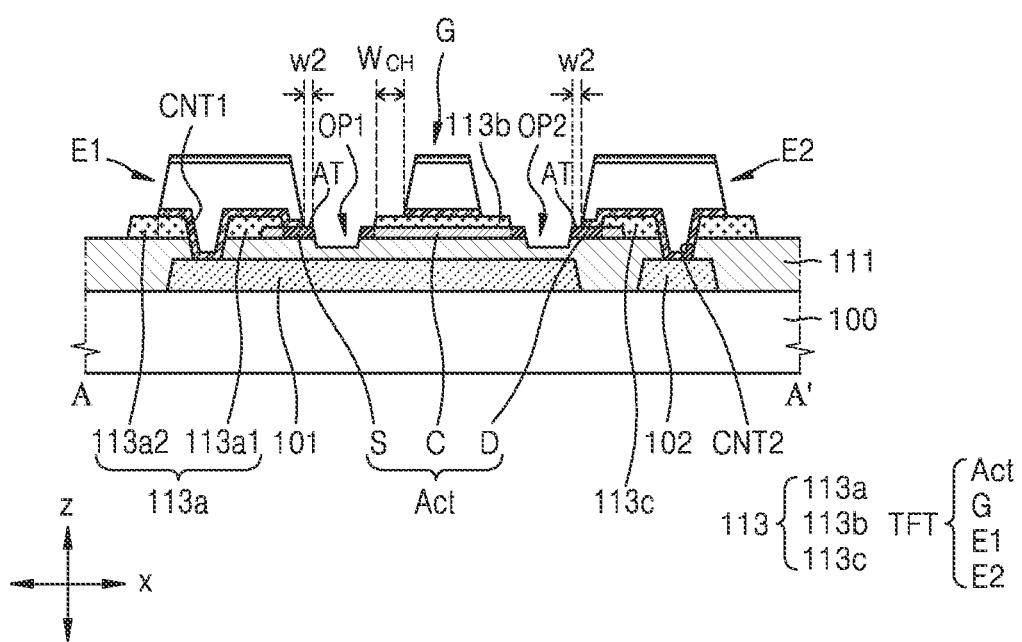
Figure 17B:
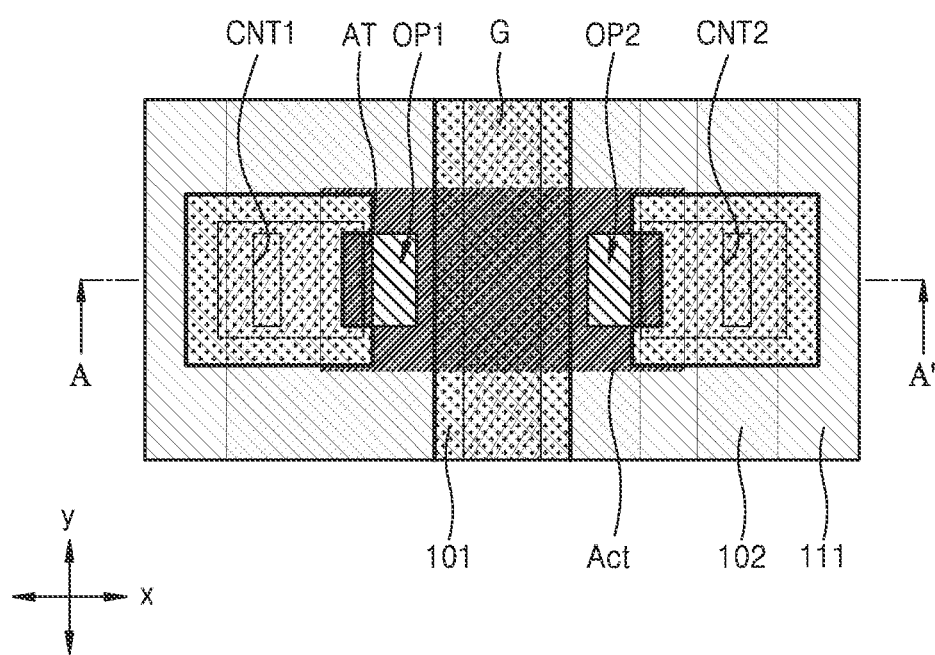
Figure 17C:
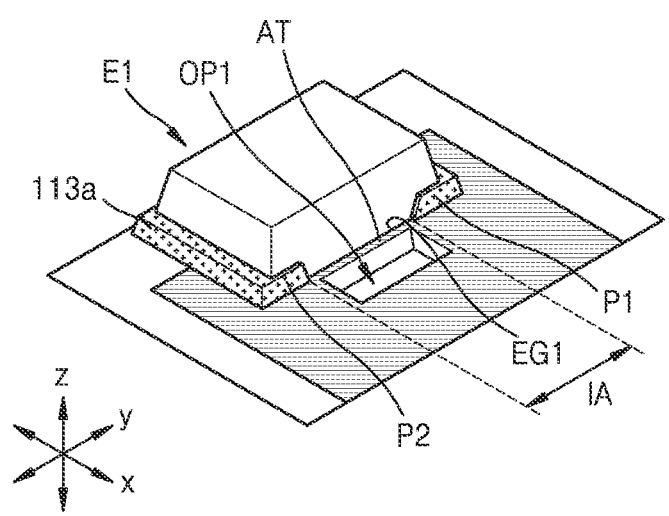
FIG. 17C is a schematic perspective view of a portion of the display apparatus of FIG. 17A.

Referring to FIGS. 17A and 17C, the edge portion 113a2 of the first insulating pattern 113a may include the first portion P1 and the second portion P2 spaced apart from each other with the spaced area IA therebetween. The first portion P1 may have the first width W1.

The first electrode E1 may include an edge different from the first edge EG1, and the edge portion 113a2 of the first insulating pattern 113a may include a third portion (not shown) extending from the edge of the first electrode E1 that is different from the first edge EG1 of the first electrode E1. A width of the third portion may be different from the first width W1 of the first portion P1 and the second portion P2 and may be greater than the first width W1.

However, referring to FIGS. 17A and 17C, regardless of the third portion not adjacent to the first opening portion OP1, the first portion P1 and the second portion P2 of the first insulating pattern 113a adjacent to the first opening portion OP1 may be spaced apart from the first opening portion OP1, as described above with reference to FIGS. 10A to 10D. Also, the second width W2 of the conductive tail area AT of the semiconductor layer Act between the first electrode E1 and the first opening portion OP1 may be greater than the first width W1 of the first portion P1 and the second portion P2. Thus, a conductive path electrically connecting the tail area AT adjacent to the first electrode E1 with another conductive area of the semiconductor layer Act may be stably formed.

As illustrated in FIGS. 17A to 17C, even in case that only the edge portion of the side surface of each of the first and third photoresists PR1 and PR3, the side surface being in the first direction (the x direction) toward the channel area C is formed by using a halftone mask or a slit, the conductive path (see the dashed arrow of FIG. 10D) of the semiconductor layer Act adjacent to the electrode (for example, the first electrode E1) may be stably formed, and thus, an ion drop phenomenon of the semiconductor layer Act may be prevented.

As described above, according to the display apparatus and the method of manufacturing the display apparatus according to one or more of the above embodiments of the disclosure, an ion drop phenomenon due to contact resistance may be improved by stably securing a conductive path for the movement of electrons or holes in the semiconductor layer around the electrode electrically connecting the lower conductive layer with the source area or the drain area of the semiconductor layer. However, the scope of the disclosure is not limited to the effect described above.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display apparatus comprising:
   a semiconductor layer arranged on a substrate and including a channel area, and a source area and a drain area respectively arranged at both sides of the channel area, the semiconductor layer including an opening portion arranged to be adjacent to any one of the source area and the drain area;
   an electrode overlapping in a plan view and electrically connected to one of the source area and the drain area; and
   an insulating pattern arranged between the semiconductor layer and the electrode, wherein
   a first edge of the electrode adjacent to the opening portion is spaced apart from the opening portion, and
   an edge portion of the insulating pattern adjacent to the opening portion is spaced apart from the opening portion.

2. The display apparatus of claim 1, wherein
   the insulating pattern includes an inner portion directly below the electrode and the edge portion outside the inner portion, and
   the edge portion of the insulating pattern partially surrounds the electrode so as to have a spaced area corresponding to a portion of the first edge of the electrode in a plan view.

3. The display apparatus of claim 1, wherein a portion of the semiconductor layer, the portion being directly below the electrode, includes:
   a first portion having a carrier concentration corresponding to one of the source area and the drain area; and
   a second portion having a different carrier concentration from the first portion.

4. The display apparatus of claim 2, wherein
   the edge portion of the insulating pattern includes a first portion and a second portion spaced apart from each other with the spaced area below the insulating pattern,
   each of the first portion and the second portion extends from the first edge of the electrode in a first direction toward the opening portion, and
   each of the first portion and the second portion of the edge portion has a first width in the first direction.

5. The display apparatus of claim 4, wherein
   the edge portion of the insulating pattern further includes a third portion extending from a second edge of the electrode that is different from the first edge and having a second width, and
   the second width is different from the first width.

6. The display apparatus of claim 5, wherein the second width is greater than the first width.

7. The display apparatus of claim 4, wherein the first width is less than about 0.5 μm.

8. The display apparatus of claim 1, further comprising:
   a lower conductive layer arranged below the semiconductor layer and a lower insulating layer arranged between the lower conductive layer and the semiconductor layer,
   wherein the electrode is electrically connected to the lower conductive layer through a contact hole penetrating the insulating pattern and the lower insulating layer.

9. The display apparatus of claim 1, wherein the semiconductor layer includes an oxide semiconductor material.

10. The display apparatus of claim 1, wherein the electrode is provided as a triple layer including a conductive oxide.

11. A method of manufacturing a display apparatus, the method comprising:
    forming a semiconductor layer on a substrate, the semiconductor layer including a channel area, and a source area and a drain area respectively arranged at both sides of the channel area;
    forming, in the semiconductor layer, an opening portion arranged to be adjacent to one of the source area and the drain area;
    forming an electrode overlapping in a plan view and electrically connected to one of the source area and the drain area; and
    forming an insulating pattern by etching an inorganic insulating layer arranged between the semiconductor layer and the electrode, wherein
    a first edge of the electrode adjacent to the opening portion is spaced apart from the opening portion, and
    an edge portion of the insulating pattern adjacent to the opening portion is spaced apart from the opening portion.

12. The method of claim 11, wherein
    the forming of the semiconductor layer including the source area and the drain area includes:
    forming a preliminary semiconductor layer on the substrate;
    patterning the preliminary semiconductor layer into a semiconductor layer;
    forming an inorganic insulating layer on the patterned semiconductor layer;
    forming holes by at least partially etching the inorganic insulating layer, and
    when the holes are formed, an exposed portion of the semiconductor layer becomes conductive.

13. The method of claim 11, wherein the forming of the opening portion is simultaneously performed with the forming of the insulating pattern.

14. The method of claim 11, wherein the forming of the electrode includes:
    forming a preliminary electrode layer on the inorganic insulating layer;
    forming a photoresist on the preliminary electrode layer;
    etching the preliminary electrode layer; and
    removing the photoresist.

15. The method of claim 14, wherein
    the forming of the opening portion includes etching the preliminary electrode layer, and
    when the preliminary electrode layer is etched, a portion of the semiconductor layer is removed.

16. The method of claim 14, wherein
    the photoresist includes:
    a central portion having a first thickness; and
    an edge portion of at least one side surface, the edge portion having a second thickness, and
    the second thickness is less than the first thickness.

17. The method of claim 14, wherein the forming of the photoresist includes:
    applying a photoresist layer; and
    exposing an edge of at least one side surface of the photoresist layer by using a halftone mask or a slit.

18. The method of claim 16, wherein the edge portion of the at least one side surface of the photoresist includes an edge portion of a side surface of the photoresist, the side surface being toward the channel area of the semiconductor layer.

19. The method of claim 16, wherein
    the forming of the insulating pattern includes:

forming the inorganic insulating layer on the semiconductor layer;
etching the photoresist; and
etching the inorganic insulating layer, and
when the photoresist is etched, the edge portion having the second thickness is removed.

20. The method of claim 11, wherein the semiconductor layer includes an oxide semiconductor.

\* \* \* \* \*